(12) United States Patent
Nakayama et al.

(10) Patent No.: US 8,389,135 B2
(45) Date of Patent: Mar. 5, 2013

(54) OXIDE SINTERED BODY, TARGET, TRANSPARENT CONDUCTIVE FILM OBTAINED BY USING THE SAME, AND TRANSPARENT CONDUCTIVE SUBSTRATE

(75) Inventors: Tokuyuki Nakayama, Ichikawa (JP); Yoshiyuki Abe, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 931 days.

(21) Appl. No.: 12/226,874

(22) PCT Filed: May 11, 2007

(86) PCT No.: PCT/JP2007/059774
§ 371 (c)(1),
(2), (4) Date: Oct. 30, 2008

(87) PCT Pub. No.: WO2007/141994
PCT Pub. Date: Dec. 13, 2007

(65) Prior Publication Data
US 2009/0101493 A1    Apr. 23, 2009

(30) Foreign Application Priority Data
Jun. 8, 2006   (JP) ................. 2006-159266

(51) Int. Cl.
*B32B 15/04*   (2006.01)
*C04B 35/04*   (2006.01)
*C04B 35/10*   (2006.01)
*C04B 35/453*  (2006.01)

(52) U.S. Cl. ........ 428/701; 428/432; 428/633; 428/688; 428/689; 428/697; 428/699; 428/702; 501/125; 501/135; 501/153

(58) Field of Classification Search .................. 428/432, 428/633, 403, 688, 689, 697, 699, 701, 702; 501/125, 135, 153
See application file for complete search history.

(56) References Cited

U.S. PATENT DOCUMENTS
(Continued)

FOREIGN PATENT DOCUMENTS
JP    51-092684    8/1976
JP    04-104937    4/1992
(Continued)

OTHER PUBLICATIONS
JP-10-306367 English machine translation.*
(Continued)

*Primary Examiner* — Jennifer McNeil
*Assistant Examiner* — Lauren Colgan
(74) *Attorney, Agent, or Firm* — Kratz, Quintos & Hanson, LLP

(57) ABSTRACT

An oxide sintered body having zinc oxide as a main component and containing magnesium, and a transparent conductive substrate are provided, and an oxide sintered body having zinc oxide and magnesium, wherein content of magnesium is from 0.02 to 0.30 as atom number ratio of Mg/(Zn+Mg); an oxide sintered body having zinc oxide, magnesium, gallium and/or aluminum, wherein content of gallium and/or aluminum is over 0 and equal to or lower than 0.09 as atom number ratio of (Ga+Al)/(Zn+Ga+Al), and content of magnesium is from 0.02 to 0.30 as atom number ratio of Mg/(Zn+Ga+Al+Mg); a target obtained by processing these oxide sintered bodies; and a transparent conductive film formed on a substrate by a sputtering method or an ion plating method, by using this target.

21 Claims, 1 Drawing Sheet

U.S. PATENT DOCUMENTS

| | | | |
|---|---|---|---|
| 5,672,427 A * | 9/1997 | Hagiwara et al. | 428/403 |
| 5,990,416 A * | 11/1999 | Windisch et al. | 136/255 |
| 6,458,673 B1 * | 10/2002 | Cheung | 438/479 |
| 6,528,442 B1 * | 3/2003 | Kuwano et al. | 501/41 |
| 7,682,529 B2 * | 3/2010 | Osada | 252/519.51 |
| 7,686,985 B2 * | 3/2010 | Osada | 252/519.51 |
| 2004/0166379 A1 | 8/2004 | Nakahara | 428/701 |

FOREIGN PATENT DOCUMENTS

| | | |
|---|---|---|
| JP | 04-219359 | 8/1992 |
| JP | 08-199343 | 8/1996 |
| JP | 10-306367 | * 11/1998 |
| JP | 2000-178725 | 6/2000 |
| JP | 2002-075061 | 3/2002 |
| JP | 2002-075062 | 3/2002 |
| JP | 2004-259549 | 9/2004 |
| WO | WO-2005/078152 | 8/2005 |
| WO | WO-2005/083722 | 9/2005 |

OTHER PUBLICATIONS

Ye Y M et al: "Fabrication of p-type ZnMgO codoped with Al and N using dc reactive magnetron sputtering" Applied Surface Science, Elsevier, Amsterdam, NL, vol. 253, No. 4, Jun. 6, 2006, pp. 2345-2347, XP024892538; ISSN: 0169-4332, DOI: DOI:10.1016/J.APSUSC.2006.04.039 [retrieved on Dec. 15, 2006] available online Jun. 6, 2006; *abstract*; figures 1, 4; p. 2345, col. 1, lines 2-5, p. 2345, col. 2, lines 6-13, p. 2346, col. 1, lines 7-10.

Özgür Ü et al: "A comprehensive review of ZnO materials and devices", Journal of Applied Physics, American Institute of Physics. New York, US, vol. 98, No. 4, Aug. 30, 2005, pp. 41301-041301, XP012078334, ISSN: 0021-8979 *p. 3, col. 2, lines 39-43.

Supplemental European Search Report dated Apr. 28, 2011.

International Search Report mailed Aug. 21, 2007, issued on PCT/JP2007/059774.

* cited by examiner

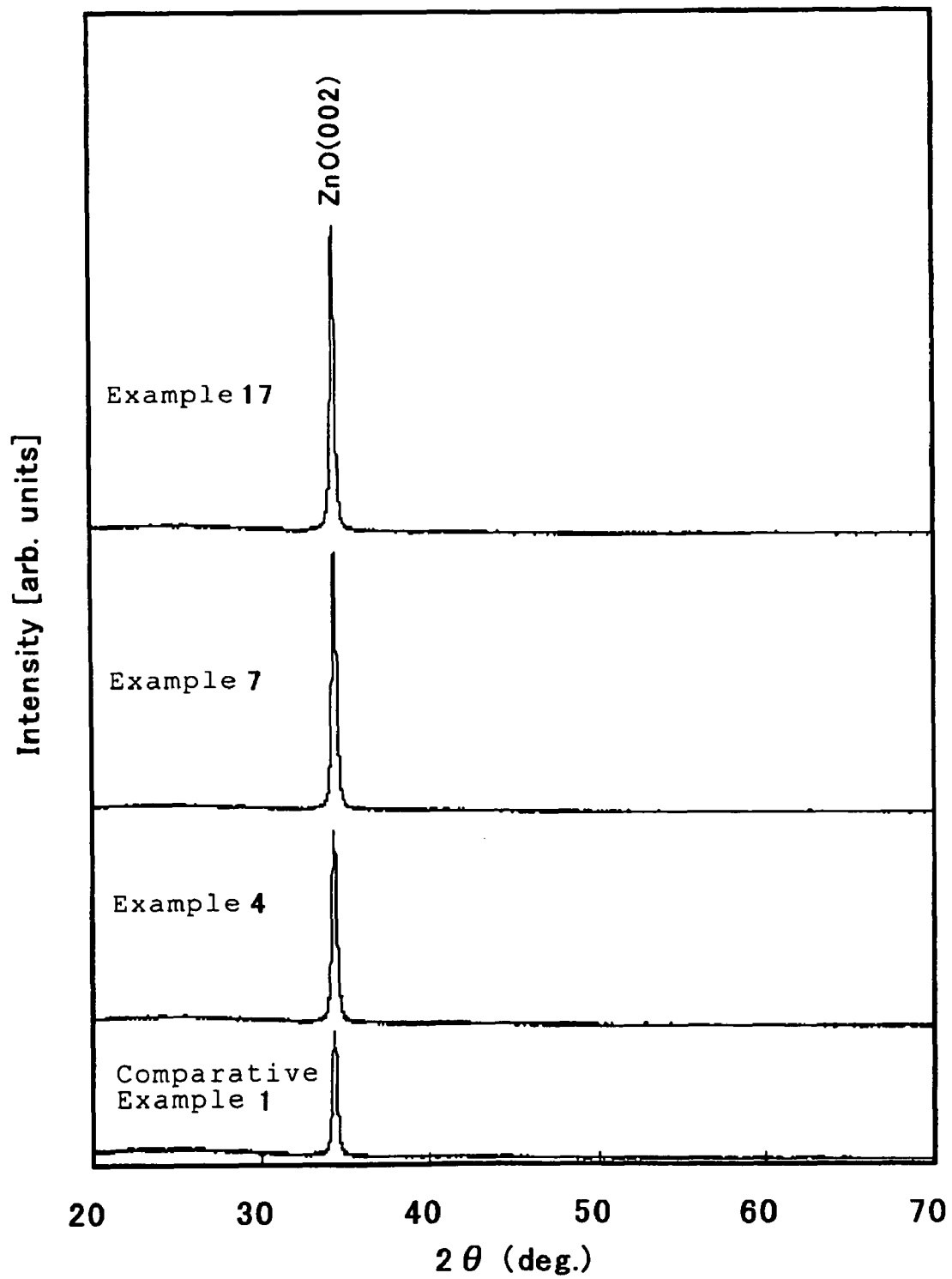

OXIDE SINTERED BODY, TARGET, TRANSPARENT CONDUCTIVE FILM OBTAINED BY USING THE SAME, AND TRANSPARENT CONDUCTIVE SUBSTRATE

BACKGROUND OF THE INVENTION

1. Field of the Invention

The present invention relates to an oxide sintered body, a target and a transparent conductive film obtained by using the same, and a transparent conductive substrate, and in more detail, the present invention relates to an oxide sintered body having zinc oxide as a main component, and still more containing magnesium, a target obtained by processing the same, a transparent conductive film having excellent chemical resistance and low resistance, obtained by a direct-current sputtering method or an ion plating method by using the same, and a transparent conductive substrate.

2. Description of the Prior Art

A transparent conductive film has high electrical conductivity and high visible light transmittance. The transparent conductive film has been utilized in an electrode or the like, for a solar cell or a liquid crystal display element, and other various light receiving elements, as well as a heat ray reflection film for an automotive window or construction use, an antistatic film, and a transparent heat generator for various anti-fogging for a refrigerator showcase and the like.

As the transparent conductive film, there has been known a thin film of tin oxide ($SnO_2$)-type, zinc oxide (ZnO)-type, indium oxide ($In_2O_3$)-type. As the tin oxide-type, one containing antimony as a dopant (ATO), or one containing fluorine as a dopant (FTO) has been utilized. As the zinc oxide-type, one containing aluminum as a dopant (AZO), or one containing gallium as a dopant (GZO) has been utilized. The transparent conductive film most widely used industrially is the indium oxide-type. Among them, indium oxide containing tin as a dopant is called an ITO (Indium-Tin-Oxide) film, and has been utilized widely, because, in particular, a film with low resistance can be obtained easily.

The transparent conductive film with low resistance is suitably used in a display element or a touch panel or the like, such as for a solar cell, a liquid crystal, an organic electroluminescence and an inorganic electroluminescence. As a method for producing these transparent conductive films, a sputtering method or an ion plating method has been used often. In particular, a sputtering method is an effective method in film-formation of a material with low vapor pressure, or when control of precise film thickness is required, and because of very simple and easy operation thereof, it has been widely used industrially.

A sputtering method is a film-formation method using a sputtering target as a raw material of a thin film. The target is a solid containing a metal element constituting the thin film to be formed, and a sintered body such as a metal, a metal oxide, a metal nitride, a metal carbide, or, in certain cases, a single crystal is used. In this method, in general, after making a vacuuming apparatus to high vacuum once, rare gas such as argon is introduced, and under a gas pressure of about 10 Pa or lower, a substrate is set as an anode and a sputtering target is set as a cathode to generate glow discharge between them and generate argon plasma, and argon cations in the plasma are collided with the sputtering target of a cathode, and particles of the target component flicked thereby are deposited on a substrate to form a film.

In addition, a sputtering method is classified by a generation method of argon plasma, and method using high frequency plasma is called a high frequency sputtering method, and method using direct-current plasma is called a direct-current sputtering method.

In general, a direct-current sputtering method has been utilized industrially in a wide range, because it provides higher film-formation rate and lower cost of power source facility and simpler film-formation operation, as compared with a high frequency sputtering method. However, a direct-current sputtering method has a disadvantage of requiring use of a conductive target, as compared with a high frequency sputtering method, which can provide film-formation even by using an insulating target.

Film-formation rate, in using a sputtering method for film-formation, has close relation to chemical bond of a target substance. Because a sputtering method utilizes a phenomenon that argon cations having a kinetic energy are collided to the target surface, and a substance of a target surface is flicked by receiving energy, weaker inter-ionic bond or inter-atomic bond of the target substance increases more probability jumping out by sputtering.

As a film-formation method of a transparent conductive film of an oxide such as ITO by using a sputtering method, there are a method for film-formation of an oxide film by a reactive sputtering method in mixed gas of argon and oxygen, by using an alloy target (an In—Sn alloy in the case of the ITO film) of elements constituting the film, and a method for film-formation of an oxide film by a reactive sputtering method in mixed gas of argon and oxygen, by using an oxide sintered body target (an In—Sn—O sintered body in the case of the ITO film) of elements constituting the film.

Among these, in a method for using the alloy target, relatively high amount of oxygen is supplied during sputtering, and because dependence of film-formation rate or film characteristics (specific resistance, transmittance) on amount of oxygen gas introduced during film-formation is extremely high, it is difficult to produce stably a transparent conductive film having a constant film thickness or desired characteristics. On the other hand, in a method using the oxide target, a part of oxygen to be supplied to a film is supplied from the target by sputtering, and residual deficient oxygen amount is supplied as oxygen gas. Therefore, dependence of film-formation rate or film characteristics (specific resistance, transmittance) on amount of oxygen gas introduced during film-formation is lower as compared with the case where the alloy target is used, and a transparent conductive film having a constant film thickness or characteristics can be produced more stably, and for this reason, a method for using the oxide target has been adopted industrially.

In consideration of productivity or production cost, a direct-current sputtering method is easier in high speed film-formation than a high frequency sputtering method. That is, in comparing film-formation rate by charging the same power to the same target, a direct-current sputtering method provides about 2 to 3 times higher rate. In addition, also in a direct-current sputtering method, charging of higher direct power is advantageous in view of productivity, because film-formation rate is more increased. Therefore, for industrial production, such a sputtering target becomes useful that is capable of providing film-formation stably, even when high direct-current power is charged.

On the other hand, an ion plating method is a film-formation method by locally heating the surface of a target material to be a film, by arc discharge, followed by sublimation, ionization and adhering onto a work charged minus. Both methods have features that a film with good adhesion can be provide at low temperature, extremely many kinds of substrate properties or film properties can be selected, film-formation of an alloy or a compound is possible, and is environmentally-friendly processes. An ion plating method, similarly to sputtering, is also capable of producing more stably a transparent conductive film having constant film thickness and characteristics, when an oxide tablet is used.

As described above, although an indium oxide-type material such as ITO has been used industrially in a wide range, in recent years, a non-indium-type material has been required, because indium, which is a rare metal, is expensive.

As the non-indium-type material, as described above, a zinc oxide-type material such as GZO or AZO, or a tin oxide-type material such as FTO or ATO is known. In particular, zinc oxide-type material has been noticed as a non-expensive material which is low cost, because of being underground abundantly as resource, and exhibits low specific resistance and high transmittance comparable to ITO. However, although a zinc oxide-type transparent conductive film obtained by using this has a merit of easy dissolution to usual acid and alkali, on the other hand, because it is poor in resistance to acid/alkali, and also difficult to control etching rate, it is difficult to be subjected to high precision patterning processing by wet etching, which is essential in a liquid crystal display application or the like. Therefore, applications thereof are limited to a solar cell and the like not requiring patterning. From these reasons, it has been a problem to improve chemical resistance of a zinc oxide-type material.

As an attempt to improve chemical resistance of a zinc oxide-type transparent conductive film, there are the following Examples. In Patent Document 1, there are proposals of a ZnO-type transparent conductive film by the co-addition of new impurities, a target material for producing the thin film and patterning technology, aiming at easy control of chemical characteristics of the ZnO-type transparent conductive film, without largely impairing visible light transmittance and electric specific resistance, by the co-addition of a donor impurity selected from aluminum (Al) or the like of group III elements or silicon (Si) or the like of group IV elements, together with chromium (Cr), to zinc oxide (ZnO).

However, Cr is known to have strong toxicity, therefore consideration should be paid so as not to give adverse effect on environment or a human body. In addition, because etching liquid must be controlled in a lower temperature range of from 20 to 5° C. than in a usual case, industrial application is difficult.

In addition, in Patent Document 2, there are proposals of an impurity co-added ZnO transparent conductive film in which cobalt (Co) or vanadium (V) is co-added instead of chromium (Cr), and a target material to be used for producing said thin film, or the like. However, cobalt (Co), similar to indium (In), is a rare metal. In addition, because vanadium (V) has toxicity, consideration should be paid so as not to give adverse effect on environment or a human body. In addition, in the addition of any of these, similarly to in Patent Document 1, because etching liquid must be controlled in a lower temperature range of from 20 to 5° C. than in a usual case, industrial application is difficult.

In addition, a method has been proposed for obtaining a transparent conductive film having improved crystallinity and etching characteristics and low resistance and excellent processability, without lowering mobility caused by scattering of ionized impurities (refer to Patent Document 3). Here, there is shown the formation (EXAMPLE 2) of an AZO film added with Mg, by using an RF magnetron sputtering method as a film-formation method, and by using a target affixed with an MgO chip onto a sintered body containing 2% by weight of $ZnO:Al_2O_3$. According to this method, it is described that the AZO film containing Mg in an atomic concentration of 5%, as ratio to Zn, in a film formed at a substrate temperature of 300° C., has a specific resistance reduced from 300 $\mu\Omega$cm to 200 $\mu\Omega$cm, and an etching rate by HCl enhanced 3 times, as compared with a film not containing Mg produced under the same condition. That is, it is shown that the addition of Mg rather lowers acid resistance, which is one of chemical resistance. In addition, there is no description on alkali resistance.

Under these circumstances, such a target has been required that does not contain components having toxicity giving adverse effect on environment or a human body, and is excellent in chemical resistance such as acid resistance, alkali resistance.

Patent Document 1: JP-A-2002-075061
Patent Document 2: JP-A-2002-075062
Patent Document 3: JP-A-8-199343

SUMMARY OF THE INVENTION

It is an object of the present invention, in view of the above problems of conventional technology, to provide an oxide sintered body having zinc oxide as a main component and still more containing magnesium, a target obtained by processing the same, a transparent conductive film having excellent chemical resistance and low resistance, obtained by a direct-current sputtering method or an ion plating method by using the same.

The present inventors have intensively studied a way to solve the above-described conventional problems and found that, in an oxide sintered body having zinc oxide as a main component and still more containing magnesium, by setting content of magnesium to be from 0.02 to 0.30 as atom number ratio of Mg/(Zn+Mg), a zinc oxide-type transparent conductive film having high chemical resistance to acid and alkali and low resistance, can be obtained by using it as a target in a direct-current sputtering method or the like, and also electrical conductivity of the obtained zinc oxide-type transparent conductive film is still more enhanced by using, as a target, an oxide sintered body further containing gallium and/or aluminum in specific amount, and have thus completed the present invention.

That is, according to a first aspect of the present invention, there is provided an oxide sintered body, characterized in that contains zinc oxide and magnesium, and content of magnesium is from 0.02 to 0.30 as atom number ratio of Mg/(Zn+Mg).

In addition, according to a second aspect of the present invention, in the first aspect, there is provided the oxide sintered body described in the claim 1, characterized in that content of magnesium is from 0.05 to 0.18 as atom number ratio of Mg/(Zn+Mg).

Still more, according to a third aspect of the present invention, in the first or second aspect, there is provided the oxide sintered body, characterized in that specific resistance is equal to or lower than 50 k$\Omega$cm.

On the other hand, according to a fourth aspect of the present invention, there is provided an oxide sintered body, characterized in that contains zinc oxide, magnesium, gallium and/or aluminum, and content of gallium and/or aluminum is over 0 and equal to or lower than 0.09 as atom number ratio of (Ga+Al)/(Zn+Ga+Al), and content of magnesium is from 0.02 to 0.30 as atom number ratio of Mg/(Zn+Ga+Al+Mg).

In addition, according to a fifth aspect of the present invention, in the fourth aspect, there is provided the oxide sintered body, characterized in that content of magnesium is from 0.05 to 0.18 as atom number ratio of Mg/(Zn+Ga+Al+Mg).

In addition, according to a sixth aspect of the present invention, in the fourth aspect, there is provided the oxide sintered body, characterized in that content of gallium and/or aluminum is from 0.01 to 0.08 as atom number ratio of (Ga+Al)/(Zn+Ga+Al).

In addition, according to a seventh aspect of the present invention, in the fourth aspect, there is provided the oxide sintered body, characterized in that content of gallium and/or aluminum is from 0.035 to 0.08 as atom number ratio of (Ga+Al)/(Zn+Ga+Al), and content of magnesium is from 0.098 to 0.18 as atom number ratio of Mg/(Zn+Ga+Al+Mg).

In addition, according to an eighth aspect of the present invention, in any aspect of the fourth to the seventh, there is provided the oxide sintered body, characterized in that peak intensity ratio by X-ray diffraction measurement represented by the following expression (A) is equal to or lower than 15%:

$$I[MgGa_2O_4(311)+MgAl_2O_4(311)]/I[ZnO(101)]\times100 \text{ (\%)} \quad (A)$$

(wherein $I[MgGa_2O_4(311)+MgAl_2O_4(311)]$ represents sum of (311) peak intensity of a complex oxide $MgGa_2O_4$ phase having a rock salt structure of cubic crystal, and (311) peak intensity of a $MgAl_2O_4$ phase, and $I[ZnO(101)]$ represents (101) peak intensity of an zinc oxide phase having a wurtzite structure of hexagonal crystal).

In addition, according to a ninth aspect of the present invention, in any aspect of the fourth to the eighth, there is provided the oxide sintered body, characterized in that the specific resistance is equal to or lower than 5 kΩcm.

Still more, according to a tenth aspect of the present invention, in any aspect of the first to the ninth, there is provided the oxide sintered body, characterized in that the magnesium oxide phase is not contained substantially.

According to an eleventh aspect of the present invention, in any aspect of the first to the tenth, there is provided the oxide sintered body, characterized in that the oxide sintered body is obtained by formation and sintering by using a hot press method.

On the other hand, according to a twelfth aspect of the present invention, there is provided a target obtained by processing the oxide sintered body in any of the first to the eleventh aspects.

In addition, according to a thirteenth aspect of the present invention, in the twelfth aspect, there is provided the target, characterized in that density thereof is equal to or higher than 5.0 g/cm$^3$, and is used in a sputtering method.

Still more, according to a fourteenth aspect of the present invention, in the twelfth aspect, there is provided the target, characterized in that the density thereof is from 3.5 to 4.5 g/cm$^3$, and is used in an ion plating method.

On the other hand, according to a fifteenth aspect of the present invention, there is provided a transparent conductive film formed on a substrate by a sputtering method or an ion plating method, by using the target according to the invention of the twelfth to the fourteenth aspects.

In addition, according to a sixteenth aspect of the present invention, in the fifteenth aspect, there is provided the transparent conductive film, characterized in that contains zinc oxide and magnesium, and content of magnesium is from 0.02 to 0.30 as atom number ratio of Mg/(Zn+Mg).

In addition, according to a seventeenth aspect of the present invention, in the fifteenth aspect, there is provided the transparent conductive film, characterized in that contains zinc oxide, magnesium, gallium and/or aluminum, and content of gallium and/or aluminum is over 0 and equal to or lower than 0.09 as atom number ratio of (Ga+Al)/(Zn+Ga+Al), and content of magnesium is from 0.02 to 0.30 as atom number ratio of Mg/(Zn+Ga+Al+Mg).

In addition, according to a eighteenth aspect of the present invention, in the seventeenth aspect, there is provided the transparent conductive film, characterized in that content of magnesium is from 0.05 to 0.18 as atom number ratio of Mg/(Zn+Ga+Al+Mg).

In addition, according to a nineteenth aspect of the present invention, in the seventeenth aspect, there is provided the transparent conductive film, characterized in that content of gallium and/or aluminum is from 0.01 to 0.08 as atom number ratio of (Ga+Al)/(Zn+Ga+Al).

In addition, according to a twentieth aspect of the present invention, in the seventeenth aspect, there is provided the transparent conductive film, characterized in that content of gallium and/or aluminum is from 0.035 to 0.08 as atom number ratio of (Ga+Al)/(Zn+Ga+Al), and content of magnesium is from 0.098 to 0.18 as atom number ratio of Mg/(Zn+Ga+Al+Mg).

In addition, according to a twenty-first aspect of the present invention, in the fifteenth to the twentieth aspect, there is provided the transparent conductive film, characterized in that is composed of mainly a zinc oxide phase having a wurtzite structure of hexagonal crystal, and peak intensity ratio by X-ray diffraction measurement represented by the following expression (B) is equal to or lower than 50%:

$$I[ZnO(002)]/(I[ZnO(002)]+I[ZnO(100)])\times100 \text{ (\%)} \quad (B)$$

Wherein $I[ZnO(002)]$ represents (002) peak intensity of the zinc oxide phase having a wurtzite structure of hexagonal crystal, and $I[ZnO(100)]$ represents (100) peak intensity of the zinc oxide phase having a wurtzite structure of hexagonal crystal.

Still more, according to a twenty-second aspect of the present invention, in the fifteenth to the twenty-first aspects, there is provided the transparent conductive film, characterized in that the zinc oxide phase having a rock salt structure of cubic crystal is not contained substantially.

In addition, according to a twenty-third aspect of the present invention, there is provided a transparent conductive substrate, characterized in that provides a transparent substrate and the transparent conductive film described in any of the fifteenth to the twenty-second aspects formed on one surface or both surfaces of the transparent substrate, and the transparent substrate is any of a glass plate, a quartz plate, a resin plate or a resin film whose one surface or both surfaces is covered with a gas barrier film, or a resin plate or a resin film inserted with a gas barrier film inside thereof.

In addition, according to a twenty-fourth aspect of the present invention, in the twenty-third aspect, there is provided the transparent conductive substrate, characterized in that the gas barrier film is at least one selected from a silicon oxide film, a silicon oxynitride film, a magnesium aluminate film, a tin oxide film and a diamond-like carbon film.

Still more, according to a twenty-fifth aspect of the present invention, in the twenty-third aspect, there is provided the transparent conductive substrate, characterized in that the resin plate or resin film is made of polyethyleneterephtharate, polyethersulfone, polyarylate, polycarbonate, or a laminated structure body made of the resin whose surface is covered with an acrylic organic substance.

According to the present invention, because an oxide sintered body has zinc oxide as a main component and still more contains the specific amount of magnesium, a transparent conductive film excellent in chemical resistance can be formed, by using this as a sputtering target, without generation of arc discharge even by direct-current sputtering. In addition, by making an oxide sintered body containing still more gallium and/or aluminum in specific amount, electrical conductivity of the obtained transparent conductive film can be improved further.

In addition, an oxide sintered body of the present invention can be used similarly to a tablet for ion plating, and is capable of attaining high speed film-formation. A zinc oxide-type transparent conductive film of the present invention obtained by using this, because of being controlled to have an optimal composition and crystal phase, exhibits excellent chemical resistance without impairing widely visible light transmittance and electric specific resistance, and is extremely useful industrially as a transparent conductive film without using relatively expensive indium, and can be used suitably as a transparent conductive substrate using the transparent conductive film.

BRIEF DESCRIPTION OF THE DRAWINGS

FIG. 1 is a graph showing identification result of a generated phase of a transparent conductive film by X-ray diffraction measurement.

DETAILED DESCRIPTION OF THE INVENTION

Explanation will be given below in detail on an oxide sintered body, a target and a transparent conductive film obtained by using the same, and a transparent conductive substrate of the present invention.
1. An Oxide Sintered Body An oxide sintered body of the present invention is characterized in that contains zinc oxide and magnesium, and content of magnesium is from 0.02 to 0.30 as atom number ratio of Mg/(Zn+Mg) (hereafter it may also be referred to as a first oxide sintered body).

In addition, an oxide sintered body of the present invention is characterized in that contains zinc oxide, magnesium, gallium and/or aluminum, and content of gallium and/or aluminum is over 0 and equal to or lower than 0.09 as atom number ratio of (Ga+Al)/(Zn+Ga+Al), and content of magnesium is from 0.02 to 0.30 as atom number ratio of Mg/(Zn+Ga+Al+Mg) (hereafter it may also be referred to as a second oxide sintered body).

(1) The First Oxide Sintered Body

The first oxide sintered body of the present invention is an oxide having zinc oxide as a main component, and still more containing magnesium in specific amount. Content of magnesium is from 0.02 to 0.30 as atom number ratio of Mg/(Zn+Mg). Because of containing magnesium in the above composition range, use of this oxide sintered body as a raw material of a target enhances chemical resistance of a transparent conductive film which has zinc oxide as a main component and is formed by a sputtering method or the like.

Here, explanation will be given on relation between chemical resistance of a transparent conductive film and content of magnesium, by classifying to acid resistance and alkali resistance. Content of magnesium below 0.02 as atom number ratio of Mg/(Zn+Mg) provides insufficient acid resistance as well as alkali resistance of the obtained transparent conductive film, while the content over 0.30 is not capable of providing sufficient acid resistance, due to lowering of crystallinity of the film, as will be described later. However, alkali resistance becomes better with higher content of magnesium, and is good enough even when the content is over 0.30. In addition, the content of magnesium over 0.30 lowers crystallinity of the film, resulting in high specific resistance. In order to make direct-current (DC) sputtering possible, specific resistance is required to be equal to or lower than 50 kΩcm, and thus tendency for specific resistance to become higher is not preferable. In order to reduce specific resistance, it is desirable that, in producing an oxide sintered body, for Example, sintering or heat treatment under reduction atmosphere is added. In view of the above circumstance, particularly preferable content of magnesium is a ratio of from 0.05 to 0.18 as atom number ratio of Mg/(Zn+Mg).

In the present invention, an oxide sintered body is composed of mainly a zinc oxide phase, and this zinc oxide phase indicates one having a wurtzite structure of hexagonal crystal described in a JCPDS card 36-1451, and also includes one with a non-stoichiometric composition of oxygen deficiency or zinc deficiency. Magnesium, which is the addition element, is usually present as a solid solution in a zinc site of the above zinc oxide phase.

In an oxide sintered body of the present invention, it is preferable that a magnesium phase described in a JCPDS card 45-0946 is not contained. It is because containing of magnesium not as a solid solution in the zinc oxide phase and as a magnesium oxide phase, which is not a good electric conductor, in an oxide sintered body, provides charging by irradiation of argon ions in sputtering, and incurs dielectric breakdown and thus generates arc discharge, which makes stable film-formation by direct-current (DC) sputtering difficult.

Density of an oxide sintered body is not especially limited, however, when the oxide sintered body is used as a target for sputtering, it is preferable to be equal to or higher than 5.0 g/cm$^3$. The density lower than 5.0 g/cm$^3$ not only makes direct-current sputtering difficult but also raises a problem of significant generation of nodules. The nodules indicate fine protrusion substances generating at an erosion part of the target surface caused by sputtering, and the nodules incur abnormal discharge or splash, which in turn generates floating of coarse particles in a sputtering chamber, and these particles cause to decrease quality by adhering onto a film during film-formation. On the other hand, in the case of film-formation by an ion plating method, because of generation of crack caused by too high density of a sintered body, the density is preferably relatively low in a range of from 3.5 to 4.5 g/cm$^3$.

An oxide sintered body of the present invention is composed of a zinc oxide phase with a solid solution of mainly magnesium, and has a specific resistance of equal to or lower than 50 kΩcm, preferably equal to or lower than 30 kΩcm, and more preferably equal to or lower than 10 kΩcm, which makes stable film-formation possible by direct-current (DC) sputtering. It should be noted that there may be contained also, other than magnesium, other addition elements (for Example, indium, titanium, tungsten, molybdenum, iridium, ruthenium, rhenium and the like) in an amount not to impair objectives of the present invention. In addition, in order to enhance sintering density of an oxide sintered body, there may be added small amount of, for Example, titanium oxide, zirconium oxide, germanium oxide, indium oxide, tin oxide or the like, as a sintering co-agent. However, the sintering co-agent should be added in a range not to affect various characteristics of the film, and a range of from 0.1 to 0.3% by weight, as the oxide composition, is preferable.

(2) The Second Oxide Sintered Body

The second oxide sintered body of the present invention is characterized in that contains zinc oxide, magnesium, gallium and/or aluminum, and content of gallium and/or aluminum is over 0 and equal to or lower than 0.09 as atom number ratio of (Ga+Al)/(Zn+Ga+Al), and content of magnesium is from 0.02 to 0.30 as atom number ratio of Mg/(Zn+Ga+Al+Mg).

In the above oxide sintered body, gallium and/or aluminum, which contribute to enhancement of electrical conductivity, must be included within the above composition range. Total content of gallium and/or aluminum over 0.09 as atom number ratio of (Ga+Al)/(Zn+Ga+Al) lowers crystallinity of a transparent conductive film formed by using a target made by an oxide sintered body of the present invention as a raw material, resulting in increase in specific resistance, as well as decrease in chemical resistance, in particular, acid resistance.

In addition, when aluminum and gallium are contained together in an oxide sintered body, it is preferable that content of aluminum and gallium is from 3.2 to 6.5% by atom as atom number ratio of (Al+Ga)/(Zn+Al+Ga), and content of aluminum and gallium is from 30 to 70% by atom as atom number ratio of Al/(Al+Ga), and content of aluminum in a spinel-type oxide phase formed in the oxide sintered body is from 10 to 90% by atom as atom number ratio of Al/(Al+Ga). It is because use of an oxide sintered body not satisfying these composition range, that is, an oxide sintered body having excess aluminum or gallium as a target of direct-current sputtering, tends to generate abnormal discharge easily in the case of aluminum, or tends to generate particles easily, in the case of gallium. In particular, generation thereof is significant when high direct-current power is charged, or sputtering is carried out for a long period. Cause of abnormal discharge generating in the case of aluminum, is considered to be in the spinel-type oxide phase formed in the above oxide sintered body, and it is solved by co-presence of aluminum and gallium in this phase, in the above composition range. The problem of particles, generating in the case of gallium, is solved by a similar method.

In addition, as described above, the content of magnesium of below 0.02 as atom number ratio of Mg/(Zn+Ga+Al+Mg), cannot provide a transparent conductive film with sufficient acid resistance and alkali resistance, while the content over 0.30 cannot provide sufficient acid resistance, and also results in to increase specific resistance, and thus not preferable. In addition, in order to obtain low specific resistance as well as excellent acid resistance and alkali resistance, it is further suitable that total content of gallium and/or aluminum is in a range of from 0.01 to 0.08 as atom number ratio of (Ga+Al)/(Zn+Ga+Al), and content of magnesium is in a range of from 0.05 to 0.18 as atom number ratio of Mg/(Zn+Ga+Al+Mg).

Still more, in order to obtain further lower specific resistance and excellent acid resistance and alkali resistance, it is important that total content of gallium and/or aluminum is in a range of from 0.035 to 0.08 as atom number ratio of (Ga+Al)/(Zn+Ga+Al), and content of magnesium is in a range of from 0.098 to 0.18 as atom number ratio of Mg/(Zn+Ga+Al+Mg). Reason for this limited composition region to be useful will be described later at the item of a transparent conductive film.

In the present invention, an oxide sintered body is composed of mainly a zinc oxide phase, and this zinc oxide phase indicates one having a wurtzite structure of hexagonal crystal described in a JCPDS card 36-1451, and also includes one with a non-stoichiometric composition of oxygen deficiency or zinc deficiency. Magnesium, which is the addition element, is usually present as a solid solution in a zinc site of the above zinc oxide phase.

When gallium and/or aluminum, and magnesium are mainly constituted by a zinc oxide phase composed of a solid solution within the above composition range, it is possible to obtain an electrical conductivity of equal to or lower than 5 kΩcm, more preferably equal to or lower than 1 kΩcm, therefore, higher power can be applied in film-formation by direct-current (DC) sputtering, and high speed film-formation is possible. It should be noted that there may be contained also, other than magnesium, other addition elements (for Example, indium, titanium, tungsten, molybdenum, iridium, ruthenium, rhenium and the like) in an amount not to impair objectives of the present invention. In addition, in order to enhance sintering density of an oxide sintered body, there may be added small amount of, for Example, titanium oxide, zirconium oxide, germanium oxide, indium oxide, tin oxide or the like, as a sintering co-agent. However, the sintering co-agent should be added in a range not to affect various characteristics of the film, and a range of from 0.1 to 0.3% by weight, as the oxide composition, is preferable.

In addition, in an oxide sintered body of the present invention, it is preferable that a complex oxide $MgGa_2O_4$ phase containing magnesium and gallium described in a JCPDS card 10-0113, and a complex oxide $MgAl_2O_4$ phase containing magnesium and aluminum described in a JCPDS card 21-1152, are present in a range of equal to or lower than 15%, still more equal to or lower than 10% as a ratio of peak intensity by (101) of a zinc oxide phase having a wurtzite structure of hexagonal crystal obtained by X-ray diffraction measurement, and peak intensity by (311) of a complex oxide $MgGa_2O_4$ phase having a rock salt structure of cubic crystal and peak intensity by (311) of a $MgAl_2O_4$ phase defined by the following expression (A). It is the most preferable one where the complex oxide $MgGa_2O_4$ phase and a complex oxide $MgAl_2O_4$ phase are not contained.

$$I[MgGa_2O_4(311)+MgAl_2O_4(311)]/I[ZnO(101)]\times100\ (\%) \quad (A)$$

Here, $I[MgGa_2O_4(311)+MgAl_2O_4(311)]$ represents sum of (311) peak intensity of the complex oxide $MgGa_2O_4$ phase having a rock salt structure of cubic crystal obtained by X-ray diffraction measurement and (311) peak intensity of the $MgAl_2O_4$ phase, and $I[ZnO(101)]$ represents (101) peak intensity of the zinc oxide phase having a wurtzite structure of hexagonal crystal obtained by X-ray diffraction measurement.

When the complex oxide $MgGa_2O_4$ phase containing magnesium and gallium and the complex oxide $MgAl_2O_4$ phase containing magnesium and aluminum are present in a range of over the above intensity ratio in an oxide sintered body, a zinc oxide phase having a rock salt structure of cubic crystal is generated in a film, therefore acid resistance is significantly lowered. In addition, when content of magnesium is high, in particular, when atom number ratio of Mg/(Zn+Ga+Al+Mg) is in a range of from 0.10 to 0.30, the magnesium oxide phase, or the complex oxide $MgGa_2O_4$ phase containing magnesium and gallium, and the complex oxide $MgAl_2O_4$ phase containing magnesium and aluminum tend to be generated easily, therefore, it is required to produce the oxide sintered body by a process under suitably set conditions to be described in the next item.

Density of an oxide sintered body is not especially limited, however, when the oxide sintered body is used as a target for sputtering by the above reason, it is preferable to be equal to or higher than 5.0 g/cm$^3$. When the oxide sintered body is used as a target for ion plating, the density is preferably relatively low in a range of from 3.5 to 4.5 g/cm$^3$.

2. Production of an Oxide Sintered Body

An oxide sintered body of the present invention is not especially limited by a production method therefor. For Example, it can be produced by a method containing a step for forming a compact from raw material powders, and a step for sintering the compact by charging it into a sintering furnace. It is desirable that there is no generation of the above magnesium oxide phase in the oxide sintered body of the present invention, however, generation thereof depends on largely, for Example, particle size, mixing condition and sintering condition of raw material powders, among production conditions.

(1) Formation of a Compact

In the step for forming a compact from raw material powders, in the case of the first oxide sintered body, magnesium oxide powders are added to zinc oxide powders as raw material powders, and in the case of the second oxide sintered body, gallium oxide powders and/or aluminum oxide powders containing a group III element of the periodic table, are added thereto and mixed. The group III element of the periodic table contributes largely to produce a sintered body having high density and high electrical conductivity.

The raw material powders are not especially limited by average particle size, however, it is desirable to use any of these powders with average particle size of equal to or smaller than 3 μm, in particular, equal to or smaller than 1 μm. In order to suppress generation of the magnesium oxide phase in the oxide sintered body, it is effective to use mixed powders obtained by ball mill mixing for equal to or longer than 24 hours, by using, for Example, zinc oxide powders with an average particle size of equal to or smaller than 1 μm, magnesium oxide powders with an average particle size of equal to or smaller than 1 μm, and gallium oxide powders with an average particle size of equal to or smaller than 1 μm, and/or aluminum oxide powders with an average particle size of equal to or smaller than 1 μm.

In particular, when atom number ratio of Mg/(Zn+Ga+Al+Mg) is in a range of from 0.10 to 0.30, not only the magnesium oxide phase but also the complex oxide $MgGa_2O_4$ phase containing magnesium and gallium, and the complex oxide $MgAl_2O_4$ phase containing magnesium and aluminum tend to be generated easily, therefore, it is preferable to carry out ball mixing for 36 hours or longer, although it depends on morphology of raw material powders. When the average particle size is over 3 μm, or the mixing time is below 24 hours, each component is not mixed homogeneously, and gallium and/or aluminum, and magnesium become difficult to make a solid solution in the zinc oxide phase in the above composition range, resulting in presence of the magnesium oxide phase, or the complex oxide $MgGa_2O_4$ phase containing magnesium and gallium, and the complex oxide $MgAl_2O_4$ phase containing magnesium and aluminum in the zinc oxide phase of the obtained oxide sintered body, and it is not preferable.

In general, in a zinc oxide-type oxide sintered body, in the preparation of an oxide sintered body for a target which enables stable film-formation, it is preferable to use an oxide of an element to be added to an zinc oxide, as raw material powders, however, it can also be produced from raw material powders in combination of zinc oxide powders and metal powders of other element to be added. However, presence of metal powders (particles) added into an oxide sintered body results in melting of metal particles at the target surface during film-formation, and increases in composition difference between the target and the film, and it is not preferable.

The raw material powders are mixed and stirred by using a known apparatus, then added with a binder (for Example, PVA) or the like to make granules, and then subjected to adjustment in a range of from 10 to 100 μm, and pressure forming under a pressure of, for Example, equal to or higher than 1000 kg/cm³, to make a compact. Subsequently, by press forming of the raw material powders in a mold, powders are compressed to become aggregated particles with high density and enhanced bulk density, and thus a compact with higher density can be obtained. The pressure lower than 1000 kg/cm³ provides insufficient enhancement of bulk density, and cannot expect satisfactory density enhancement effect.

(2) Sintering of a Compact

A sintering step subsequent to the forming step is a step for sintering the compact by charging it into a sintering furnace, and a sintering method may be any of a simple normal pressure sintering method or a hot press method.

In the case of the normal pressure sintering method, for Example, sintering is carried out under atmosphere introducing oxygen into air inside the sintering furnace, at from 1100° C. to 1500° C., preferably at from 1200° C. to 1500° C., for from 10 to 30 hours, preferably for from 15 to 25 hours. When the temperature is lower than 1100° C., it provides insufficient progress of sintering, resulting in low density and high resistance value of a sintered body. In addition, a target produced from the obtained sintered body generates a trouble in sputtering such as slow film-formation rate, abnormal discharge or the like, and thus not preferable. In increasing temperature up to sintering temperature, in order to prevent crack of the sintered body and promote de-binder, it is preferable for temperature increasing rate to be set in a range of from 0.2 to 5° C./min. Still more, in order to make a sufficient solid solution of magnesium into a zinc oxide lattice so as not to generate a magnesium oxide phase in the sintered body, it is still more preferable for temperature increasing rate to be set in a range of equal to or higher than 0.2° C./min and lower than 1° C./min. The temperature increasing rate lower than 0.2° C./min is not only unsuitable to practical operation but also may raise, in some cases, a problem of significant crystal growth of the sintered body. In addition, if necessary, different temperature increasing rates may be combined to raise temperature up to sintering temperature. In the step for increasing temperature, specific temperature may be held for a certain period aiming at promoting de-binder or sintering. In cooling after sintering, introduction of oxygen is stopped, and it is preferable to lower temperature down to 1000° C. at temperature decreasing rate in a range of from 0.2 to 5° C./min, in particular, equal to or higher than 0.2° C./min and lower than 1° C./min.

According to the step as described above, by using fine raw material powders and mixing sufficiently and sintering at sintering temperature sufficient to progress diffusion, magnesium oxide powders will not remain, that is, a magnesium oxide phase will not present in the oxide sintered body. However, a complex oxide or the like may be generated corresponding to composition or the like.

The hot press method, as compared with the above normal pressure sintering method, carries out forming and sintering of raw material powders of an oxide sintered body under reducing atmosphere, therefore it is possible to reduce the content of oxygen in the sintered body. A zinc oxide-type transparent conductive film, because of having extremely high affinity between zinc and oxygen, reduces various characteristics including specific resistance, in the case of high content of oxygen in the sintered body. The hot press method is inferior to the normal pressure sintering method in view of production cost or the like, however, useful when required characteristics is high to a transparent conductive film. In the present invention, in order to obtain a transparent conductive film with strong crystal orientation, it is particularly useful to produce an oxide sintered body by adopting the hot press method.

An Example of production condition of an oxide sintered body by the hot press method of the present invention is shown. That is, zinc oxide powders with an average particle size of equal to or smaller than 1 μm, magnesium oxide powders with an average particle size of equal to or smaller than 1 μm, and gallium oxide powders with an average particle size of equal to or smaller than 1 μm, and/or aluminum oxide powders with an average particle size of equal to or smaller than 1 μm are prepared, as raw material powders, so as to be predetermined ratio. The prepared raw materials are uniformly mixed by a dry-type ball mill or a V-blender or the like, and then supplied into a carbon container to be subjected to sintering by the hot press method. Sintering temperature may be set at from 1000 to 1200° C., pressure may be set at from 2.45 MPa to 29.40 MPa (25 kgf/cm$^2$ to 300 kgf/cm$^2$), and sintering time may be set from about 1 to 10 hours. Atmosphere during hot press is preferably in inert gas such as Ar gas or in vacuum. In the case of a target for sputtering, more preferably, sintering temperature may be set at from 1050 to 1150° C., pressure may be at from 9.80 MPa to 29.40 MPa (100 kgf/cm$^2$ to 300 kgf/cm$^2$), and sintering time may be from 1 to 3 hours. In addition, in the case of a target for ion plating, more preferably, sintering temperature may be set at from 1000 to 1100° C., pressure may be at from 2.45 MPa to 9.80 MPa (25 kgf/cm$^2$ to 100 kgf/cm$^2$), and sintering time may be from 1 to 3 hours.

3. A Target

An oxide sintered body produced by the above method may be converted to a target (which may be called also a single target) by processing by surface grinding or the like to obtain predetermined dimension, and adhering it to a backing plate. If necessary, required number of sintering bodies may be arranged in a divided shape to prepare a target with large area (which may be called a complex target).

A target includes a target for sputtering and a target for ion plating. It should be noted that, in an ion plating method, such a material may be called a tablet, however, in the present invention, it is named a target generically. Density thereof is preferably equal to or higher than 5.0 g/cm$^3$ in a target for sputtering, and from 3.5 to 4.5 g/cm$^3$ in a target for ion plating. In the case of a target for sputtering, the density lower than 5.0 g/cm$^3$ not only makes direct-current sputtering difficult but also raises a problem of significant generation of nodules.

A target is one based on a zinc oxide-type sintered body having zinc oxide as a main component and mainly composed of a zinc oxide phase where magnesium is present as a solid solution, or one based on an oxide sintered body having zinc oxide as a main component and mainly composed of a zinc oxide phase where gallium and/or aluminum, and magnesium are present as a solid solution.

4. Production of a Transparent Conductive Film

A transparent conductive film of the present invention is formed on a substrate, in a film-formation apparatus, by a sputtering method or an ion plating method, by using the above target of the present invention. In particular, a direct-current (DC) sputtering method is industrially advantageous and preferable, due to providing small thermal influence during film-formation and is capable of high speed film-formation.

That is, in producing a transparent conductive film of the present invention, there is used a method for forming a transparent conductive film composed of zinc oxide containing magnesium on the substrate, or zinc oxide containing gallium and/or aluminum and magnesium, by using a target obtained from the above oxide sintered body, and by adopting sputtering or ion plating condition such as specified substrate temperature, gas pressure, charging power.

In order to form a transparent conductive film by the present invention, it is preferable to use argon or the like as sputtering gas, and to use direct-current sputtering. In addition, sputtering may be carried out under a pressure of from 0.1 to 1 Pa, in particular from 0.2 to 0.8 Pa, inside the sputtering apparatus.

In the present invention, pre-sputtering may be carried out, for Example, by introducing pure Ar gas after vacuum exhausting to equal to or lower than $5 \times 10^{-5}$ Pa, and applying a direct-current power of from 100 to 300 W to generate direct-current plasma. It is preferable that sputtering is carried out, after this pre-sputtering for from 5 to 30 minutes, by correcting substrate position, if necessary.

In the present invention, film-formation may be carried out without heating the substrate, however, the substrate may be heated also at from 50 to 300° C., in particular, at from 80 to 200° C. When the substrate is one made of such as a resin plate, a resin film having low melting point, film-formation without heating the substrate is desirable.

By using a sputtering target prepared from the above oxide sintered body of the present invention, a transparent conductive film with excellent chemical resistance and electrical conductivity can be produced on the substrate, by a direct-current sputtering method, therefore production cost can be reduced to a large extent.

In addition, also in the case of using a target for ion plating (it may be called a tablet or a pellet) prepared from the above oxide sintered body, a transparent conductive film can be formed similarly. In an ion plating method, irradiation of electron beams or heat by arc discharge or the like onto a target to become an evaporation source, raises temperature locally at a part irradiated, by which evaporated particles are evaporated and deposited onto a substrate. In this case, evaporated particles are ionized by electron beams or arc discharge. There are various methods for ionization, however, a high density plasma assisted vapor deposition method (HDPE method) using a plasma generation apparatus (a plasma gun) is suitable for forming a transparent conductive film with good quality. In this method, arc discharge using the plasma gun is utilized. Arc discharge is maintained between a built-in cathode in the plasma gun and an evaporation source crucible (anode). By introducing electrons emitted from the cathode into the crucible by magnetic deflection, irradiation is concentrated onto a local part of the target incorporated in the crucible. By this electron beams, evaporated particles are evaporated from a locally high temperature part, and deposited onto the substrate. Because evaporated particles thus vaporized or $O_2$ gas introduced as reaction gas is ionized and activated in this plasma, a transparent conductive film with good quality can be prepared.

5. A Transparent Conductive Film

A transparent conductive film of the present invention is formed on a substrate by a sputtering method or an ion plating method, by using the above target.

That is, it is a transparent conductive film produced by a sputtering method or an ion plating method, by using a target processed from the above oxide sintered body, and is characterized by (1) a transparent conductive film having zinc oxide as a main component, and still more containing magnesium, and containing magnesium in a ratio of from 0.02 to 0.30 as atom number ratio of Mg/(Zn+Mg), or (2) a transparent conductive film having zinc oxide as a main component, and still more containing magnesium, gallium and/or aluminum, and containing gallium and/or aluminum in a ratio of over 0 and equal to or lower than 0.09 as atom number ratio of (Ga+Al)/(Zn+Ga+Al), and magnesium in a ratio of from 0.02 to 0.30 as atom number ratio of Mg/(Zn+Ga+Al+Mg).

A conventional zinc oxide-type transparent conductive film had a problem that it easily dissolves into usual acid and alkali and is poor in resistance to acid/alkali, and also difficult to control etching rate, therefore it is difficult to be subjected to high precision patterning processing by wet etching, which is essential in a liquid crystal display application or the like. Because the present invention uses a sputtering target or an ion plating target, which enables to provide high speed film-formation by an industrially useful direct-current sputtering method or an ion plating method and little generates arc discharge, a zinc oxide-type transparent conductive film having high chemical resistance to an acid and an alkali, can be obtained without impairing electric and optical characteristics. In particular, by controlling the composition and the crystal phase of the film, a zinc oxide-type transparent conductive film exhibiting high chemical resistance can be obtained.

A transparent conductive film of the present invention is formed by using the above oxide sintered body as a raw material, therefore it is preferable that the composition of the oxide sintered body is reflected. That is, it is desirable to be a transparent conductive film having zinc oxide as a main component, and still more containing magnesium, and containing magnesium in a ratio of from 0.02 to 0.30 as atom number ratio of Mg/(Zn+Mg); or a transparent conductive film having zinc oxide as a main component, and still more containing magnesium, gallium and/or aluminum, and containing gallium and/or aluminum in a ratio of over 0 and equal to or lower than 0.09 as atom number ratio of (Ga+Al)/(Zn+Ga+Al), and magnesium in a ratio of from 0.02 to 0.30 as atom number ratio of Mg/(Zn+Ga+Al+Mg).

This transparent conductive film exhibits excellent chemical resistance by having zinc oxide as a main component, and containing magnesium in the above composition range. When the content of magnesium is below 0.02 as atom number ratio of Mg/(Zn+Mg), the transparent conductive film does not exhibit sufficient acid resistance and alkali resistance, when content is over 0.30, crystallinity of the film is lowered resulting in that sufficient acid resistance cannot be obtained. However, alkali resistance becomes better with increasing content of magnesium, and thus alkali resistance is sufficiently good even when the content is over 0.30. When the content of magnesium is over 0.30 and crystallinity of the film is lowered, also electrical conductivity is lost.

A transparent conductive film is capable of exhibiting also higher electrical conductivity, by further containing gallium and/or aluminum in the above range. When the content of gallium and/or aluminum is over 0.9 as atom number ratio of (Ga+Al)/(Zn+Ga+Al), crystallinity of the film is lowered resulting in that sufficient acid resistance cannot be obtained.

Still more, in order that this transparent conductive film exhibits excellent chemical resistance and low specific resistance, it is still more preferable that total content of gallium and/or aluminum is from 0.01 to 0.08 as atom number ratio of (Ga+Al)/(Zn+Ga+Al), and content of magnesium is from 0.098 to 0.18 as atom number ratio of Mg/(Zn+Ga+Al+Mg).

Still more, in order to obtain still lower specific resistance, and excellent acid resistance and alkali resistance, composition of the transparent conductive film is still more preferably in a range that total content of gallium and/or aluminum is from 0.035 to 0.08 as atom number ratio of (Ga+Al)/(Zn+Ga+Al), and content of magnesium is from 0.098 to 0.18 as atom number ratio of Mg/(Zn+Ga+Al+Mg). It has been known that a zinc-oxide-type transparent conductive film is capable of providing a crystal film even in film-formation at room temperature, and orients in the c-plane (002), however, it has been made clear that the transparent conductive film having the above composition range exhibits extremely strong orientation. It has been made clear in the present invention that, in comparison with a transparent conductive film formed by using a generally used zinc oxide sintered body containing gallium or aluminum as a target, peak intensity by c-plane (002) reflection exhibits extremely high value of about 2.5 times as maximum, and by this effect, far lower specific resistance and excellent chemical resistance can be obtained. It should be noted that such strong crystal orientation cannot be obtained by making only magnesium in the above composition range. It is required that also amount of gallium is made in the above composition range.

In addition, in order to obtain the above strong crystal orientation, it is preferable that content of oxygen in a film is low. That is, it is effective to form a film in a state that content of oxygen is reduced, in an oxide sintered body, that is, in a target utilizing a HP method in the formation and sintering step, and in a state of reducing atmosphere to the utmost extent.

In the above Patent Document 3, an AZO film (Example 2) added with Mg by, what is called, on-chip sputter, which is obtained by an RF magnetron sputtering method as a film-formation method, using a sintered body target with 25% by weight of $ZnO:Al_2O_3$ adhered with an MgO chip, is shown. However, it is known that MgO is generally very stable, and this method results in preferential sputtering at the part of the sintered body target with 25% by weight of $ZnO:Al_2O_3$. According to an experiment by the present inventors, it has been cleared that, even in the case of covering with the MgO chip over a most part of the erosion region to be efficiently sputtered, in the sintered body target with 25% by weight of $ZnO:Al_2O_3$, Mg is little added, and stays only in a concentration of about 0.5% by atom, based on Zn ratio. It is extremely difficult to obtain the AZO film added with Mg in an amount of over 1%, if the above target of the present invention is not used, where Mg is not present as MgO, and Mg is present as a solid solution in a ZnO lattice.

A transparent conductive film of the present invention is mainly composed of a zinc oxide phase of a wurtzite structure of hexagonal crystal described in a JCPDS card 36-1451, however, in order to obtain high electrical conductivity and excellent acid resistance, crystallinity of the film is important as described above.

That is, it is important that the c-plane of the zinc oxide phase having a wurtzite structure of hexagonal crystal is oriented in parallel to a substrate. In particular, it is preferable that peak intensity ratio by X-ray diffraction measurement represented by the following expression (B) is equal to or lower than 50%, more preferably equal to or higher than 70% and still more preferably equal to or higher than 90%.

$$I[ZnO(002)]/(I[ZnO(002)]+I[ZnO(100)])\times100\ (\%) \quad (B)$$

Here, I[ZnO(002)] represents (002) peak intensity of the zinc oxide phase having a wurtzite structure of hexagonal crystal, and I[ZnO(100)] represents (100) peak intensity of the zinc oxide phase having a wurtzite structure of hexagonal crystal. The peak intensity ratio below 50% not only impairs electrical conductivity but also cannot provide sufficient acid resistance.

In addition, when magnesium is contained in excess of 0.30, as atom number ratio of Mg/(Zn+Ga+Al+Mg), or when a magnesium oxide phase or a complex oxide $MgGa_2O_4$ phase containing magnesium and gallium, and a complex oxide $MgAl_2O_4$ phase containing magnesium and aluminum are contained in an oxide sintered body, which is a raw material, contribution of the magnesium oxide having a rock salt structure of cubic crystal, or the complex oxide $MgGa_2O_4$ phase containing magnesium and gallium, and the complex oxide $MgAl_2O_4$ phase containing magnesium and aluminum becomes large, resulting in formation of the zinc oxide phase having a rock salt structure of cubic crystal, in the transparent conductive film. The zinc oxide phase of a cubic crystal structure not only incurs higher specific resistance of the transparent conductive film, but also reduces acid resistance, therefore it is preferable not to be contained in the film. Even when intensity ratio of X-ray diffraction of expression (B) is equal to or higher than 50%, sufficient acid resistance cannot be obtained, when the zinc oxide of a cubic crystal structure is contained.

A transparent conductive film of the present invention is used as a wiring material for a liquid crystal display or the like, however, in order to attain this, it is important that patterning can be done by wet etching using a photoresist. That is, in order to enable patterning by wet etching, it is necessary to exhibit suitable etching rate in a range of from 30 to 100 nm/min, to a weak acidic organic acid (ITO-06N manufactured by Kanto Chemical Co., Inc.), and not to be etched with weak alkali.

In addition, when it is used as a functional transparent conductive film such as an antistatic application, minimum weatherability is required. That is, it is necessary to have weak acid resistance equivalent to a degree as described above, and to exhibit an etching rate of equal to or lower than 20 nm/min. to weak alkali (5% KOH).

A transparent conductive film of the present invention is produced, as described above, by using a target obtained by processing an oxide sintered body added with magnesium to zinc oxide, or still more gallium and/or aluminum in a suitable composition range, and by suitably controlling structure and crystallinity of the film, therefore, it has excellent acid resistance and alkali resistance. Therefore, it is possible to sufficiently satisfy the above etching characteristics.

In the present invention, thickness of a transparent conductive film is not especially specified, because it differs depending on applications, however, it is from 20 to 500 nm, and preferably from 100 to 300 nm. The thickness below 20 nm cannot ensure sufficient specific resistance, while the thickness over 500 nm results in raising a problem of coloring of the film, and thus it is not preferable.

In addition, average visible light transmittance (400 to 800 nm) of a transparent conductive film is equal to or higher than 80%, preferably equal to or higher than 85% and still more preferably equal to or higher than 90%. The average transmittance below 80% makes applications to an organic EL element and the like difficult.

6. A Transparent Conductive Substrate

In the present invention, the above transparent conductive film is converted to a transparent conductive substrate formed on any of a substrate (substrate plate), usually selected from a glass plate, a quartz plate, a resin plate or a resin film.

This transparent conductive substrate is one to have the above transparent conductive film function as an anode and/or a cathode of a display panel of such as LCD, PDP or an EL element. Because the substrate also functions as a light transmittable supporting body, it is required to have a certain strength and transparency.

As a material constituting the resin plate or the resin film, there may be included polyethyleneterephtharate (PET), polyethersulfone (PES), polyarylate (PAR), polycarbonate (PC) and the like, and it may be the resin plate or the resin film having a structure covered with an acrylic resin on the surface thereof.

Thickness of the substrate is not especially limited, however, it is set to be from 0.5 to 10 mm, preferably from 1 to 5 mm for the glass plate or the quartz plate, and from 0.1 to 5 mm, preferably from 1 to 3 mm for the resin plate or the resin film. Thinner thickness than this range weakens strength and makes handling thereof difficult, while thicker thickness than this range not only deteriorates transparency but also makes heavy, and thus not preferable.

On the above substrate, there may be formed any of an insulation layer, a semiconductor layer, a gas barrier layer, or a protection layer made of a single layer or a multi-layer. As the insulation layer, a silicon oxide (Si—O) layer or a silicon oxynitride (Si—O—N) layer or the like is included; as the semiconductor layer, a thin film transistor (TFT) or the like is included, which is mainly formed on a glass substrate; as the gas barrier layer, there is formed a silicon oxide (Si—O) film, silicon oxynitride (Si—O—N) film, a magnesium aluminate (Al—Mg—O) film, or a tin oxide-type (for Example, Sn—Si—O) film or the like as a steam barrier film, on the resin plate or the resin film. The protection layer is one to protect the substrate surface from scratch or impact, and various coatings such as an Si-type, a Ti-type, an acrylic resin-type are used. It should be noted that a layer formable on the substrate is not limited thereto, and a thin metal film having electrical conductivity may also be applied.

A transparent conductive substrate obtained by the present invention is extremely useful as constitution parts of various display panels, because a transparent conductive film having excellent characteristics in view of specific resistance, light transmittance, surface flatness or the like, is formed thereon. In addition, as parts mounted with an electronic circuit provided with the above transparent conductive substrate, laser parts and the like other than an organic EL element are included.

EXAMPLES

Explanation will be given below in more detail with reference to Example of the present invention, however, the present invention should not be limited to these Example.
(Evaluation of an Oxide Sintered Body)

Specific resistance of the obtained oxide sintered body was measured on a polished surface, by a four-probe method. In addition, the end material of the obtained oxide sintered body was crushed to carry out powder X-ray diffraction measurement and a generated phase was identified.
(Evaluation of Fundamental Characteristics of a Transparent Conductive Film)

Film thickness of the obtained transparent conductive film was measured with a surface roughness tester (manufactured by Tencor Japan Corp.). Specific resistance of the film was calculated from product of surface resistance measured by the four-probe method and film thickness. Optical characteristics of the film were measured with a spectrophotometer (manufactured by Hitachi, Ltd.). A generated phase of the film was identified by X-ray diffraction measurement (manufactured by PANanalytical Co., Ltd.). It should be noted that generation of a zinc oxide phase having a rock salt structure of cubic crystal was judged by measurement of reversed lattice space mapping, using X-ray diffraction.
(Evaluation of Chemical Resistance of a Transparent Conductive Film)

A transparent conductive film with a film thickness of about 200 nm was formed to study chemical resistance by the following procedures. As for acid resistance, the film was immersed into an organic acid etching liquid, ITO-06N, for ITO (manufactured by Kanto Chemical Co., Inc.) set at 30° C., for 20 seconds, and judged by etching rate per one minute determined from film thickness difference before and after the immersion. Alkali resistance was similarly judged by etching rate per one minute determined by immersion into a 5% KOH aqueous solution for 1 minute.

Example 1

An oxide sintered body having zinc oxide as a main component and containing magnesium was prepared as follows.

Zinc oxide powders having an average particle size of equal to or smaller than 3 µm, and magnesium oxide powders having an average particle size of equal to or smaller than 1 µm were used as raw materials, and magnesium oxide was prepared so that content as magnesium becomes 0.10 as atom number ratio of Mg/(Zn+Mg). Raw material powders were charged in a pot made of a resin, together with water to mix in a wet-type ball mill. In this case, hard-type $ZrO_2$ balls were used, and mixing time was set to 36 hours. After mixing, slurry was taken out, and subjected to filtering, drying and granulating. The obtained granules were converted to a compact under a pressure of 3 tons/cm$^2$, using a cold isostatic press.

Then, the compact was sintered as follows. Air atmosphere inside a sintering furnace was heated up to 1000° C. at a temperature increasing rate of 0.5° C./minute. After temperature reached 1000° C., oxygen was introduced into air inside the sintering furnace, at a rate of 5 L/minute per 0.1 m$^3$ of inner volume of the furnace, and maintained the furnace at 1000° C. as it is for 3 hours. Subsequently, temperature was raised again up to 1400° C. of sintering temperature, at a temperature increasing rate of 0.5° C./minute, and after temperature reached 1400° C., the temperature was held for 15 hours to carry out sintering. In cooling after sintering, introduction of oxygen was stopped and temperature was lowered to 1000° C. at a rate of 0.5° C./minute, to prepare an oxide sintered body composed of zinc oxide and magnesium. By analysis of composition of the obtained oxide sintered body, it was confirmed that the composition was nearly the same as the formulation composition. By measurement of specific resistance value of the oxide sintered body, it was confirmed that the specific resistance was equal to or lower than 50 kΩcm. In addition, density thereof was 5.5 g/cm$^3$.

By phase identification of the oxide sintered body by X-ray diffraction measurement, only a zinc oxide phase having a wurtzite structure of hexagonal crystal was confirmed, and a diffraction peak originating from a magnesium oxide phase having a rock salt structure of cubic crystal was not confirmed. Because gallium and/or aluminum were not contained in the oxide sintered body, diffraction peaks originating from a complex oxide $MgGa_2O_4$ phase containing magnesium and gallium, and a complex oxide $MgAl_2O_4$ phase containing magnesium and aluminum, were not present. That is, peak intensity ratio defined by the above expression (A) was 0%.

Such an oxide sintered body was subjected to bonding to a backing plate made of oxygen-free copper using metal indium, to prepare a target for sputtering. It was processed to a size of 152 mm in diameter and 5 mm in thickness, and the sputtering surface thereof was polished using a cup grinding stone so that Rz of maximal height becomes equal to or lower than 3.0 µm.

Film-formation was carried out by direct-current sputtering by using this as a sputtering target. The sputtering target was attached to a cathode for a non-magnetic body target of a direct-current magnetron sputtering apparatus (manufactured by ANELVA Corp.) provided with a direct-current power source not having arcing suppression function. A non-alkali glass substrate (Corning #7059) was used as a substrate, and distance between the target and the substrate was fixed to 46 mm. Pure Ar gas was introduced after vacuum exhausting up to equal to or lower than $7 \times 10^{-5}$ Pa, to make gas pressure to 0.2 Pa, and a direct-current power of 300 W was applied to generate direct-current plasma to carry out pre-sputtering. After sufficient pre-sputtering, the substrate was arranged just over the sputtering target, that is, at a stationary opposed position, and sputtering was carried out without heating to form a transparent conductive film.

Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $2.7 \times 10^{-3}$ Ωcm.

Then, etching rate when the obtained transparent conductive film was immersed in ITO-06N was measured, and it was found to be 70 nm/min., showed moderate etching rate to the acid. In the case of immersion into 5% KOH, etching was not observed at all, and sufficient alkali resistance was obtained. Results are shown in Table 1.

Comparative Example 1

A conventional oxide sintered body made of zinc oxide doped with gallium was prepared. Zinc oxide powders and gallium oxide powders were used as raw materials, and the gallium oxide was prepared so that content as gallium becomes 0.05 as atom number ratio of Ga/(Zn+Ga).

By measurement of specific resistance value of the obtained oxide sintered body, it was confirmed that the specific resistance was equal to or lower than 1 kΩcm. In addition, density thereof was 5.7 g/cm$^3$. By phase identification of the oxide sintered body using X-ray diffraction measurement, only a zinc oxide phase having a wurtzite structure of hexagonal crystal was confirmed.

The oxide sintered body was subjected to bonding to prepare a sputtering target and film-formation by direct-current sputtering was carried out. Arc-discharge was not generated, and stable film-formation was possible.

Identification result of the generated phase of the obtained transparent conductive film using X-ray diffraction measurement is shown in FIG. 1. Constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. In addition, specific resistance of the film was measured and found to be $8.3 \times 10^{-4}$ Ωcm.

Then, etching rate when the obtained transparent conductive film was immersed in ITO-06N was measured, and found to be 560 nm/min. It was clarified that the etching rate showed far higher value as compared with moderate etching rate. In the case of immersing into 5% KOH, etching rate became 180 nm/min, clarified that alkali resistance also was low. Results are shown in Table 1.

Example 2

An oxide sintered body having zinc oxide containing gallium and magnesium as a main component was prepared. Zinc oxide powders having an average particle size of equal to or smaller than 1 µm, gallium oxide powders having an average particle size of equal to or smaller than 1 µm, and magnesium oxide powders having an average particle size of equal to or smaller than 1 µm were used as raw materials, and gallium oxide was prepared so that content as gallium becomes 0.005 as atom number ratio of Ga/(Zn+Ga), and magnesium oxide was prepared so that content as magnesium becomes 0.02 as atom number ratio of Mg/(Zn+Ga+Mg).

Sintering was carried out similarly to in Example 1, and the composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.7 g/cm$^3$. By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carried out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $2.0 \times 10^{-3}$ Ωcm.

Then, etching rate when the obtained transparent conductive film was immersed in ITO-06N was measured, and found to be 90 nm/min., showed moderate etching rate to the acid. In the case of immersion into 5% KOH, etching rate was 20 nm/min., and sufficient alkali resistance was obtained. Results are shown in Table 1.

Example 3

An oxide sintered body having zinc oxide containing gallium and magnesium as a main component, and containing Mg of 0.02 as atom number ratio Mg/(Zn+Ga+Mg), was prepared by a similar preparation method to in Example 2, except that atom number ratio of Ga/(Zn+Ga) was changed to 0.08.

Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.7 g/cm$^3$. By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carried out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $1.9 \times 10^{-3}$ Ωcm.

Then, etching rate when the obtained transparent conductive film was immersed in ITO-0.6N was measured, and found to be 90 nm/min., showed moderate etching rate to the acid. In the case of immersing into to 5% KOH, etching rate was 20 nm/min., showed that sufficient alkali resistance was obtained. Results are shown in Table 1.

Comparative Example 2

An oxide sintered body having zinc oxide containing gallium and magnesium as a main component and containing Mg of 0.02 as atom number ratio of Mg/(Zn+Ga+Mg) was prepared by a similar preparation method to in Example 2, except that atom number ratio of Ga/(Zn+Ga) was changed to 0.10. Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.6 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carried out film-formation by direct-current sputtering. Arc-discharge was not generated, and stable film-formation was possible. It was confirmed that composition of the obtained transparent conductive film was nearly the same as that of the target.

By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, however, as compared with Example 2, peak intensity of the zinc oxide phase was lowered, and suggested decrease in crystallinity caused by excess gallium. However, peak intensity ratio of the c-plane (002) to the a-plane (100) of the zinc oxide phase defined by the above expression (B) was 100%. Specific resistance of the film was measured and found to be $6.1 \times 10^{-3}$ Ωcm.

Then, etching rate when the obtained transparent conductive film was immersed in ITO-06N was measured, and found to be 420 nm/min. It was clarified that the etching rate showed far higher value as compared with moderate etching rate and thus low acid resistance. In the case of immersion into 5% KOH, etching rate was as high as 120 nm/min, clarified that also alkali resistance was not sufficient. It was estimated that chemical resistance was lowered affected by reduced crystallinity of the zinc oxide phase having a wurtzite structure of hexagonal crystal caused by excess content of gallium. Results are shown in Table 1.

Comparative Example 3

An oxide sintered body having zinc oxide containing gallium and magnesium as a main component was prepared by a similar preparation method as in Example 2, except that atom number ratio of Ga/(Zn+Ga) was changed to 0.08, and atom number ratio of Mg/(Zn+Ga+Mg) was changed to 0.01. Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.6 g/cm³.

By phase identification of the oxide sintered body, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carried out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $1.6 \times 10^{-3}$ Ωcm.

Then, etching rate when the obtained transparent conductive film was immersed in ITO-06N was measured, and found to be 250 nm/min. It was clarified that the etching rate showed far higher value as compared with moderate etching rate and thus insufficient acid resistance. In the case of immersion into 5% KOH, etching rate was as high as 100 nm/min, clarifying that alkali resistance was also not sufficient. It was estimated that sufficient chemical resistance was not obtained because of insufficient content of magnesium. Results are shown in Table 1.

Example 4

An oxide sintered body having zinc oxide containing gallium and magnesium as a main component was prepared similarly to in Example 2, except that atom number ratio of Ga/(Zn+Ga) was changed to 0.05, and atom number ratio of Mg/(Zn+Ga+Mg) was changed to 0.05. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.6 g/cm³.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. Identification result of generated phase of the film using X-ray diffraction measurement is shown in FIG. 1. Constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited higher intensity about 1.5 times Comparative Example 1, where magnesium was not added. Specific resistance of the film was measured and found to be $9.7 \times 10^{-4}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, a certain amount of etching was observed in the etching rate of 20 nm/min.

Example 5

An oxide sintered body having zinc oxide containing gallium and magnesium as a main component, was prepared similarly to in Example 2, except that atom number ratio of Ga/(Zn+Ga) was changed to 0.01, and atom number ratio of Mg/(Zn+Ga+Mg) was changed to 0.10. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.5 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide MgGa$_2$O$_4$ phase containing magnesium and gallium was not confirmed. That is, ratio of peak intensity of the complex oxide MgGa$_2$O$_4$ phase (311) to peak intensity of the zinc oxide phase (101) defined by the above expression (A) was 0%.

The oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be 9.8×10$^{-4}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1.

Example 6

An oxide sintered body having zinc oxide containing gallium and magnesium as a main component was prepared similarly to in Example 2, except that atom number ratio of Ga/(Zn+Ga) was changed to 0.03, and atom number ratio of Mg/(Zn+Ga+Mg) was changed to 0.10. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.5 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide MgGa$_2$O$_4$ phase containing magnesium and gallium was not confirmed. That is, ratio of peak intensity of the complex oxide MgGa$_2$O$_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be 9.6×10$^{-4}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1.

Example 7

An oxide sintered body having zinc oxide containing gallium and magnesium as a main component was prepared similarly to in Example 2, except that atom number ratio of Ga/(Zn+Ga) was changed to 0.05, and atom number ratio of Mg/(Zn+Ga+Mg) was changed to 0.10. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.5 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide MgGa$_2$O$_4$ phase containing magnesium and gallium was not confirmed. That is, ratio of peak intensity of the complex oxide MgGa$_2$O$_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. Identification results of generated phase of the film using X-ray diffraction measurement is shown in FIG. 1. Constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited higher intensity about 2.0 times Comparative Example 1, where magnesium was not added. Specific resistance of the film was measured and found to be 9.8×10$^{-4}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, etching was not at all observed, showing excellent alkali resistance. By taking account of the result of Example 4 together, it is considered that acid resistance and alkali resistance were enhanced further, by synergy effect of being a suitable combination of gallium content and magnesium content, and having excellent crystallinity.

Example 8

An oxide sintered body having zinc oxide containing gallium and magnesium as a main component was prepared similarly to in Example 2, except that atom number ratio of Ga/(Zn+Ga) was changed to 0.05, and atom number ratio of Mg/(Zn+Ga+Mg) was changed to 0.18. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.4 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited higher intensity about 2.2 times Comparative Example 1, where magnesium was not added. Specific resistance of the film was measured and found to be $1.0 \times 10^{-3}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, etching was not at all observed, showing excellent alkali resistance. Reason for enabling to provide such further excellent various characteristics is considered, similarly to Example 7, to be synergy effect of being a suitable constitution of gallium content and magnesium content, and having excellent crystallinity.

Example 9

An oxide sintered body having zinc oxide containing gallium and magnesium as a main component was prepared similarly to in Example 2, except that atom number ratio of Ga/(Zn+Ga) was changed to 0.05, and atom number ratio of Mg/(Zn+Ga+Mg) was changed to 0.30. Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.1 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peaks of this zinc oxide phase having a wurtzite structure of hexagonal crystal, peaks of not only the c-plane (002) but also the a-plane (100) were observed. However, peak intensity of the a-plane (100) is low, and peak intensity ratio of the c-plane (002) to the a-plane (100) was 90%. Specific resistance of the film was measured and found to be $2.3 \times 10^{-3}$ Ωcm.

Then, etching rate when the obtained transparent conductive film was immersed in ITO-06N was measured, and found to be a moderate etching rate of 80 nm/min. In the case of 5% KOH, a little etching, in an etching rate of 10 nm/minute, was observed, showing sufficient alkali resistance. Results are shown in Table 1.

Example 10

An oxide sintered body having zinc oxide containing gallium and magnesium as a main component was prepared similarly to in Example 2, except that atom number ratio of Ga/(Zn+Ga) was changed to 0.08, and atom number ratio of Mg/(Zn+Ga+Mg) was changed to 0.30. Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.1 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peaks of this zinc oxide phase having a wurtzite structure of hexagonal crystal, peaks of not only the c-plane (002) but also the a-plane (100) were observed, and peak intensity ratio of the c-plane (002) to the a-plane (100) was 50%. Specific resistance of the film was measured and found to be $2.5 \times 10^{-3}$ Ωcm.

Then, etching rate when the obtained transparent conductive film was immersed in ITO-06N was measured, and found to be a moderate etching rate of 100 nm/min. In the case of immersion in 5% KOH, a little etching, in an etching rate of 20 nm/minute, was observed, showing sufficient alkali resistance. Results are shown in Table 1.

Comparative Example 4

An oxide sintered body having zinc oxide containing gallium and magnesium as a main component was prepared similarly to in Example 2, except that atom number ratio of Ga/(Zn+Ga) was changed to 0.08, and atom number ratio of Mg/(Zn+Ga+Mg) was changed to 0.32 (When it is 0.27, it falls under a range of claim 1, similarly to Comparable Example 5). Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.1 g/cm³.

By phase identification of the oxide sintered body using X-ray diffraction measurement, diffraction peaks originating from a zinc oxide phase having a wurtzite structure of hexagonal crystal, and from a complex oxide $MgGa_2O_4$ phase containing magnesium and gallium were observed. Ratio of peak intensity of the complex oxide $MgGa_2O_4$ phase (311) to peak intensity of the zinc oxide phase (101) defined by the above expression (A) was 25%. It should be noted that a diffraction peak originating from a magnesium oxide phase having a rock salt structure of cubic crystal was not confirmed.

Such an oxide sintered body was subjected to bonding to prepare a target for sputtering and carry out film-formation by direct-current sputtering. Arc-discharge was generated a certain extent at the initial use stage of the target, but relatively stable film-formation was possible. However, with continued use of the target, frequency of arc discharge increased, making film-formation impossible. It was confirmed that composition of the obtained transparent conductive film, obtained at the initial use stage of the target, was nearly the same as that of the target. By identification of generated phase of the film using X-ray diffraction measurement, as well as reversed lattice space mapping measurement, presence of not only the zinc oxide phase having a wurtzite structure of hexagonal crystal but also the zinc oxide phase having a rock salt structure of cubic crystal was confirmed. As for diffraction peaks of this zinc oxide phase having a wurtzite structure of hexagonal crystal, peaks of not only the c-plane (002) but also the a-plane (100) were observed, and peak intensity ratio of the c-plane (002) to the a-plane (100) was as low as 40%. Specific resistance of the film was measured and found to be $6.7 \times 10^{-3}$ Ωcm.

Then, etching rate when the obtained transparent conductive film was immersed in ITO-06N was measured, and found to be 310 nm/min. It was clarified that the etching rate showed higher value as compared with moderate etching rate and thus not sufficient acid resistance. In the case of similar immersion in 5% KOH, etching rate was 20 nm/minute, and it was not so high, clarifying sufficient alkali resistance. It was estimated that acid resistance was lowered affected by generation of the zinc oxide phase having a rock salt structure of cubic crystal, and reduced crystallinity of the zinc oxide phase having a wurtzite structure of hexagonal crystal, caused by excess content of magnesium. Results are shown in Table 1.

Example 11

An oxide sintered body having zinc oxide containing gallium and magnesium as a main component, and having an atom number ratio of Ga/(Zn+Ga) of 0.08, and an atom number ratio of Mg/(Zn+Ga+Mg) of 0.10, was prepared similarly to in Example 2, except that mixing time with a wet-type ball mill was shortened to 24 hours.

Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.0 g/cm³. By phase identification of the oxide sintered body using X-ray diffraction measurement, a magnesium oxide phase was not confirmed, other than a zinc oxide phase having a wurtzite structure of hexagonal crystal, but a diffraction peak originating from a complex oxide $MgGa_2O_4$ phase containing magnesium and gallium having a rock salt structure of cubic crystal was confirmed. Ratio of peak intensity of the complex oxide $MgGa_2O_4$ phase (311) to peak intensity of the zinc oxide phase (101) defined by the above expression (A) was 15%.

Such an oxide sintered body was subjected to bonding to prepare a target for sputtering and carry out film-formation by direct-current sputtering. Arc-discharge was generated in a very rare case, but there was not any practical trouble and fundamentally stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peaks of this zinc oxide phase having a wurtzite structure of hexagonal crystal, peaks of not only the c-plane (002) but also the a-plane (100) were observed, and peak intensity ratio of the c-plane (002) to the a-plane (100) was 90%. Specific resistance of the film was measured and found to be $1.2 \times 10^{-3}$ Ωcm.

Then, etching rate when the obtained transparent conductive film was immersed in ITO-06N was measured, and found to be a moderate etching rate of 90 nm/min, although a little faster as compared with Example 6. In the case of immersion in 5% KOH, no etching was observed, showing sufficient alkali resistance. Results are shown in Table 1.

Comparative Example 5

An oxide sintered body having zinc oxide containing gallium and magnesium as a main component was prepared by a similar preparation method to in Example 2, except that magnesium oxide powder with an average particle size of about 5 µm were used as raw material powders, mixing time with a wet-type ball mill was shortened to 2 hours, and atom number ratio of Ga/(Zn+Ga) was changed to 0.08, and atom number ratio of Mg/(Zn+Ga+Mg) was changed to 0.32. Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 4.8 g/cm$^3$.

By phase identification of the oxide sintered body using X-ray diffraction measurement, diffraction peaks originating from a magnesium oxide phase having a rock salt structure of cubic crystal, and a complex oxide $MgGa_2O_4$ phase containing magnesium and gallium, other than a zinc oxide phase having a wurtzite structure of hexagonal crystal, were observed. Ratio of peak intensity of the complex oxide $MgGa_2O_4$ phase (311) to peak intensity of the zinc oxide phase (101) defined by the above expression (A) was 45%.

The oxide sintered body was subjected to bonding to prepare a target for sputtering and carry out film-formation by direct-current sputtering. Arc-discharge was frequently generated, although specific resistance of the oxide sintered body was low, and stable film-formation was impossible. Results are shown in Table 1.

Example 12

An oxide sintered body having zinc oxide containing aluminum and magnesium as a main component, and having Al as an atom number ratio of Al/(Zn+Al) of 0.05, and Mg as an atom number ratio of Mg/(Zn+Al+Mg) of 0.02, was prepared similarly to in Example 2, except that aluminum oxide powders were used instead of gallium oxide powders as starting raw materials, in order to add aluminum instead of gallium. Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.6 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgAl_2O_4$ phase containing magnesium and aluminum was not confirmed. That is, ratio of peak intensity of the complex oxide $MgAl_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $2.1\times10^{-3}$ Ωcm.

Then, etching rate when the obtained transparent conductive film was immersed in ITO-06N was measured, and found to be a moderate etching rate of 90 nm/min. In addition, in the case immersion into 5% KOH, a little etching, in an etching rate of 20 nm/minute, was observed, showed that sufficient alkali resistance was obtained. Results are shown in Table 1.

Example 13

An oxide sintered body having zinc oxide containing aluminum and magnesium, as a main component, and having an atom number ratio of Al/(Zn+Al) of 0.3, and an atom number ratio of Mg/(Zn+Al+Mg) of 0.10, was prepared similarly to in Example 6, except that aluminum oxide powders were used instead of gallium oxide powders as starting raw materials, in order to add aluminum instead of gallium.

Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.4 g/cm$^3$. By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgAl_2O_4$ phase containing magnesium and aluminum was not confirmed. That is, ratio of peak intensity of the complex oxide $MgAl_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $9.9\times10^{-4}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1.

Example 14

An oxide sintered body having zinc oxide containing aluminum and magnesium as a main component, and having an atom number ratio of Al/(Zn+Al) of 0.05, and an atom number ratio of Mg/(Zn+Al+Mg) of 0.18, was prepared similarly to in Example 8, except that aluminum oxide powders were used instead of gallium oxide powders as starting raw materials, in order to add aluminum instead of gallium.

Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.3 g/cm³. By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgAl_2O_4$ phase containing magnesium and aluminum was not confirmed. That is, ratio of peak intensity of the complex oxide $MgAl_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited higher intensity about 2.1 times Comparative Example 1, where magnesium was not added. Specific resistance of the film was measured and found to be $1.0 \times 10^{-3}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result also, etching was not at all observed, showing excellent alkali resistance. By taking account of the result of Example 4 together, it is considered that acid resistance and alkali resistance were enhanced further, by synergy effect of being a suitable composition of aluminum amount and magnesium amount, and having excellent crystallinity.

Example 15

An oxide sintered body having zinc oxide containing gallium, aluminum and magnesium as a main component was prepared by a similar preparation method as in Example 6, except that atom number ratio of Ga/(Zn+Ga) was changed to 0.025, and atom number ratio of Al/(Zn+Al) was changed to 0.005, by substitution of a part of gallium added in Example 6 with aluminum.

Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.4 g/cm³. By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium, and a complex oxide $MgAl_2O_4$ phase containing magnesium and aluminum was not confirmed. That is, ratio of peak intensity sum of the complex oxide $MgGa_2O_4$ phase (311) and the complex oxide $MgAl_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $1.1 \times 10^{-3}$ Ωcm, showing only a little higher value as compared with Example 6.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1.

Example 16

By using a tablet made of an oxide sintered body having similar composition to in Example 6, that is, having an atom number ratio of Ga/(Zn+Ga) of 0.03, and an atom number ratio of Mg/(Zn+Ga+Mg) of 0.10, film-formation was carried out by changing the film-formation method to an ion plating method. A preparation method for the oxide sintered body is similar to in Example 1, however, as described above, in the case of using it as the tablet for ion plating, low density is required, therefore sintering temperature was set at 1000° C. The tablet was formed in advance so as to have dimension after sintering of a diameter of 30 mm and a height of 40 mm. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 3.9 g/cm³.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was used as the tablet for ion plating and carry out film-formation by an ion plating method. For film-formation, a reactive plasma vapor deposition apparatus, capable of providing a high density plasma assisted vapor deposition method (HDPE method), was used. The following film-formation conditions were adopted: distance between an evaporation source to a substrate 0.6 m, discharge current of a plasma gun 100 A, Ar flow rate 30 sccm, and $O_2$ flow rate 10 sccm.

Stable film-formation was possible, when the oxide sintered body of the present invention was used as the tablet. It was confirmed that composition of the obtained transparent conductive film was nearly the same as that of the tablet. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. Specific resistance of the film was measured and found to be $7.2 \times 10^{-4}$ Ωcm.

Then, etching rate when the obtained transparent conductive film was immersed in ITO-06N was measured, and found to be a moderate etching rate of 60 nm/min. Etching was not at all observed to 5% KOH, showed that sufficient alkali resistance was obtained. Results are shown in Table 1.

Example 17

An oxide sintered body having zinc oxide containing gallium and magnesium as a main component was prepared by a similar preparation method as in Example 2, except that atom number ratio of Ga/(Zn+Ga) was changed to 0.065, and atom number ratio of Mg/(Zn+Ga+Mg) was changed to 0.115. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.4 g/cm³.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. Identification result of generated phase of the film using X-ray diffraction measurement is shown in FIG. 1. Constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited far higher intensity as compared with Example 4 shown in FIG. 1, and higher intensity about 2.4 times Comparative Example 1, where magnesium was not added. Specific resistance of the film was measured and found to be $8.8 \times 10^{-4}$ Ωcm.

Then, etching rate when the obtained transparent conductive film was immersed in ITO-06N was measured, and found far excellent acid resistance and to be a moderate etching rate of 40 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, etching was not at all observed, showing excellent alkali resistance. It is considered that reason for obtaining further excellent various characteristics, and further enhancing acid resistance and alkali resistance, is synergy effect of being a suitable composition of gallium amount and magnesium amount, and having excellent crystallinity.

Example 18

An oxide sintered body having zinc oxide containing gallium and magnesium as a main component was prepared by a similar preparation method to in Example 2, except that atom number ratio of Ga/(Zn+Ga) was changed to 0.06, and atom number ratio of Mg/(Zn+Ga+Mg) was changed to 0.098. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.5 g/cm³.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. Result is shown in FIG. 1. Constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited far higher intensity as compared with EXAMPLE 4 shown in FIG. 1, and higher intensity about 2.1 times COMPARATIVE EXAMPLE 1, where magnesium was not added. Specific resistance of the film was measured and found to be $8.9 \times 10^{-4}$ Ωcm.

Then, etching rate when the obtained transparent conductive film was immersed in ITO-06N was measured, and found to be a moderate etching rate of 50 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, etching was not at all observed, showing excellent alkali resistance. It is considered that reason for obtaining further excellent various characteristics, and further enhancing acid resistance and alkali resistance, is synergy effect of being a suitable composition of gallium amount and magnesium amount, and having excellent crystallinity.

Example 19

An oxide sintered body having zinc oxide containing gallium and magnesium as a main component was prepared by a similar preparation method to in Example 2, except that atom number ratio of Ga/(Zn+Ga) was changed to 0.035, and atom number ratio of Mg/(Zn+Ga+Mg) was changed to 0.15. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.3 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By phase identification of the oxide sintered body using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited far higher intensity as compared with EXAMPLE 4 shown in FIG. 1, and higher intensity about 1.9 times COMPARATIVE EXAMPLE 1, where magnesium was not added. Specific resistance of the film was measured and found to be $9.7 \times 10^{-4}$ Ωcm.

Then, etching rate when the obtained transparent conductive film was immersed in ITO-06N was measured, and found to be a moderate etching rate of 60 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, etching was not at all observed, showing excellent alkali resistance. It is considered that reason for obtaining further excellent various characteristics, and further enhancing acid resistance and alkali resistance, is synergy effect of being a suitable composition of gallium amount and magnesium amount, and having excellent crystallinity.

Example 20

An oxide sintered body having zinc oxide containing gallium and magnesium as a main component was prepared by a similar preparation method to in EXAMPLE 2, except that atom number ratio of Ga/(Zn+Ga) was changed to 0.08, and atom number ratio of Mg/(Zn+Ga+Mg) was changed to 0.18. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.3 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By phase identification of the oxide sintered body using X-ray diffraction measurement, constitution of only the zinc oxide phase having a wurtzite structure of hexagonal crystal was confirmed, and presence of the zinc oxide phase having a rock salt structure of cubic crystal was not confirmed. Diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited far higher intensity as compared with Example 4 shown in FIG. 1, and higher intensity about 2.1 times Comparative Example 1, where magnesium was not added. Specific resistance of the film was measured and found to be $9.8 \times 10^{-4}$ Ωcm.

Then, etching rate when the obtained transparent conductive film was immersed in ITO-06N was measured, and found to be a moderate etching rate of 70 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, etching was not at all observed, showing excellent alkali resistance. It is considered that reason for obtaining further excellent various characteristics, and further enhancing acid resistance and alkali resistance, is synergy effect of being a suitable composition of gallium amount and magnesium amount, and having excellent crystallinity.

Example 21

An oxide sintered body having zinc oxide containing gallium and magnesium as a main component was prepared by a similar preparation method to in Example 2, except that atom number ratio of Ga/(Zn+Ga) was changed to 0.09, and atom number ratio of Mg/(Zn+Ga+Mg) was changed to 0.18, and still more, 0.2% by weight of titanium oxide was added as a sintering co-agent. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.2 g/cm$^3$.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By phase identification of the oxide sintered body using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited higher intensity about 1.4 times Comparative Example 1, where magnesium was not added. Specific resistance of the film was measured and found to be $1.2 \times 10^{-3}$ Ωcm.

Then, etching rate was measured when the obtained transparent conductive film was immersed in ITO-06N, and found to be a moderate etching rate of 70 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result, etching was a little observed, in an etching rate of 20 nm/min.

It should be noted that significant influence of the sintering co-agent on various characteristics of the film was not confirmed.

Example 22

An oxide sintered body having zinc oxide containing aluminum and magnesium as a main component, and having Al as an atom number ratio of Al/(Zn+Al) of 0.05, and Mg as an atom number ratio of Mg/(Zn+Al+Mg) of 0.098, was prepared by a similar preparation method to in Example 8, except that aluminum oxide powders were used instead of gallium oxide powders as starting raw materials, in order to add aluminum instead of gallium. Composition of the obtained oxide sintered body was analyzed, and confirmed that the composition was nearly the same as the formulation composition. By measurement of specific resistance value of the oxide sintered body, it was confirmed that the specific resistance was equal to or lower than 5 kΩcm. In addition, density thereof was 5.4 g/cm$^3$.

By phase identification of the oxide sintered body using X-ray diffraction measurement, only a zinc oxide phase having a wurtzite structure of hexagonal crystal was confirmed, and a diffraction peak by a magnesium oxide phase having a rock salt structure of cubic crystal, or a complex oxide $MgAl_2O_4$ phase containing magnesium and aluminum was not confirmed. That is, ratio of peak intensity of the complex oxide $MgAl_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. Diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited higher intensity about 2.2 times Comparative Example 1, where magnesium was not added. Specific resistance of the film was measured and found to be $2.1 \times 10^{-3}$ Ωcm.

Then, etching rate when the obtained transparent conductive film was immersed in ITO-06N was measured, and found to be a moderate etching rate of 50 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result also, etching was not at all observed, showing excellent alkali resistance. It is considered that reason for obtaining further excellent various characteristics, and further enhancing acid resistance and alkali resistance, is synergy effect of being a suitable composition of aluminum amount and magnesium amount, and having excellent crystallinity.

Example 23

An oxide sintered body having zinc oxide containing gallium, aluminum and magnesium as a main component was prepared by a similar preparation method as in Example 6, except that atom number ratio of Al/(Zn+Al) was changed to 0.025.

Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.3 g/cm³. By phase identification of the oxide sintered body using X-ray diffraction measurement, only a zinc oxide phase having a wurtzite structure of hexagonal crystal was confirmed, and a diffraction peak by a magnesium oxide phase having a rock salt structure of cubic crystal, or a complex oxide $MgGa_2O_4$ phase containing magnesium and gallium, and a complex oxide $MgAl_2O_4$ phase containing magnesium and aluminum was not confirmed. That is, ratio of peak intensity sum of the complex oxide $MgGa_2O_4$ phase (311) and the complex oxide $MgAl_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It should be noted that number of abnormal discharges per 10 minutes was measured by increasing charged direct-current power up to 500 W, however, the abnormal discharges were not generated at all. After the measurement, a particle generation state, at a non-erosion part of the target surface, was examined, however, the particle was not generated at all.

It was confirmed that composition of the obtained transparent conductive film was nearly the same as that of the target. By identification of generated phase of the film using X-ray diffraction measurement, constitution of only the zinc oxide phase having a wurtzite structure of hexagonal crystal was confirmed, and presence of the zinc oxide phase having a rock salt structure of cubic crystal was not confirmed. As diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited higher intensity about 2.0 times Comparative Example 1, where magnesium was not added. Specific resistance of the film was measured and found to be $9.1\times10^{-4}$ Ωcm.

Then, etching rate when the obtained transparent conductive film was immersed in ITO-06N was measured, and found to be a moderate etching rate of 50 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result also, etching was not at all observed, showing excellent alkali resistance. It is considered that reason for obtaining further excellent various characteristics is, similarly to in the case of the addition of gallium of Example 7, synergy effect of being a suitable composition of aluminum amount and magnesium amount, and having excellent crystallinity.

Example 24

An oxide sintered body having, as a main component, zinc oxide containing gallium as an atom number ratio of Ga/(Zn+Ga) of 0.065, and magnesium as an atom number ratio of Mg/(Zn+Ga+Mg) of 0.115, was prepared by a similar preparation method to in Example 17, except that the preparation method was changed from a normal pressure sintering method to a hot press method. The following hot press conditions were adopted: in argon atmosphere, temperature 1100° C., pressure 19.60 MPa (200 kgf/cm²) and pressurization tine 1 hour. Composition of the obtained oxide sintered body was analyzed, and confirmed that the composition was nearly the same as the formulation composition. By measurement of specific resistance value of the oxide sintered body, it was confirmed that the specific resistance was equal to or lower than 1 kΩcm. In addition, density thereof was 5.6 g/cm³.

By phase identification of the oxide sintered body using X-ray diffraction measurement, only a zinc oxide phase having a wurtzite structure of hexagonal crystal was confirmed, and a diffraction peak originating from a magnesium oxide phase having a rock salt structure of cubic crystal, or a complex oxide $MgGa_2O_4$ phase containing magnesium and gallium was not confirmed. That is, ratio of peak intensity of the complex oxide $MgGa_2O_4$ phase (311) to peak intensity of the zinc oxide phase (101) defined by the above expression (A) was 0%.

Such an oxide sintered body was subjected to bonding to prepare a target for sputtering and carry out film-formation by direct-current sputtering. Arc-discharge was not generated, and stable film-formation was possible. It was confirmed that composition of the obtained transparent conductive film was nearly the same as that of the target. Identification result of generated phase of the film using X-ray diffraction measurement is shown in FIG. 1. Constitution of only the zinc oxide phase having a wurtzite structure of hexagonal crystal was confirmed, and presence of the zinc oxide phase having a rock salt structure of cubic crystal was not confirmed. AS diffraction peak of this zinc oxide phase having a wurtzite structure of hexagonal crystal, only peak by c-plane (002) reflection was observed, and peak intensity ratio of the c-plane (002) to the a-plane (100) of the zinc oxide phase defined by the above expression (B) was 100%. It should be noted that peak intensity by c-plane (002) reflection exhibited far higher intensity as compared with Example 4 shown in FIG. 1, and higher intensity about 2.7 times Comparative Example 1, where magnesium was not added. Specific resistance of the film was measured and found to be $7.8\times10^{-4}$ Ωcm.

Then, etching rate when the obtained transparent conductive film was immersed in ITO-06N was measured, and found far excellent acid resistance and to be a moderate etching rate of 30 nm/min. Etching was not at all observed to 5% KOH, showed that sufficient alkali resistance was obtained. Results are shown in Table 1. It should be noted that as for alkali resistance to 5% KOH, a test was also carried out under severer condition of liquid temperature at 50° C. As a result also, etching was not at all observed, showing excellent alkali resistance. It is considered that reason for obtaining further excellent various characteristics as shown above, as compared with Example 17, is synergy effect of being a suitable composition of gallium amount and magnesium amount, and having excellent crystallinity, as well as by reduction of oxygen amount of the oxide sintered body and the obtained film.

Example 25

A silicon oxynitride film with a thickness of 100 nm was formed in advance, as a gas barrier film, on a PES film substrate with a thickness of 100 μm, and a transparent conductive film with a thickness of 200 nm was formed on this gas barrier film similarly to in Example 17, to prepare a transparent conductive substrate.

The obtained transparent conductive substrate had crystallinity equivalent to that of Example 17, and specific resistance thereof was $8.5\times10^{-4}$ Ωcm.

Then, etching rate when the obtained transparent conductive substrate was immersed in ITO-06N was measured, and found to be a moderate etching rate of 40 nm/min. Etching was not at all observed to 5% KOH, and also even under severer condition of liquid temperature at 50° C., confirming that the substrate had sufficient alkali resistance, similarly to in Example 17.

Still more, in Example 16, although the oxide sintered body, having zinc oxide as a main component, and still more containing magnesium and gallium in specified amounts, was

TABLE 1

| | Sintered body | | | | | | | Thin film | | | | |
|---|---|---|---|---|---|---|---|---|---|---|---|---|
| | Ga | Mg | Al | | specific | Presence or absence of phase | | Structure | | | Etching rate (nm/min) | |
| | Atomic number ratio | Atomic number ratio | Atomic number ratio | Density g/cm³ | resistance kΩ cm | Magnesium oxide | Complex oxide | c-plane orientation | Cubic crystal | specific resistance Ω cm | ITO-06N | 5% KOH | Remark |
| Example 1 | — | 0.10 | — | 5.5 | ≦50 | No | No | 100 | No | $2.7 \times 10^{-3}$ | 70 | 0 | |
| Example 2 | 0.005 | 0.02 | — | 5.7 | ≦5 | No | No | 100 | No | $2.0 \times 10^{-3}$ | 90 | 20 | |
| Example 3 | 0.08 | 0.02 | — | 5.7 | ≦5 | No | No | 100 | No | $1.9 \times 10^{-3}$ | 90 | 20 | |
| Example 4 | 0.05 | 0.05 | — | 5.6 | ≦1 | No | No | 100 | No | $9.7 \times 10^{-4}$ | 70 | 0 | |
| Example 5 | 0.01 | 0.10 | — | 5.5 | ≦1 | No | No | 100 | No | $9.8 \times 10^{-4}$ | 70 | 0 | |
| Example 6 | 0.03 | 0.10 | — | 5.5 | ≦1 | No | No | 100 | No | $9.6 \times 10^{-4}$ | 70 | 0 | |
| Example 7 | 0.05 | 0.10 | — | 5.5 | ≦1 | No | No | 100 | No | $9.8 \times 10^{-4}$ | 70 | 0 | |
| Example 8 | 0.05 | 0.18 | — | 5.4 | ≦1 | No | No | 100 | No | $1.0 \times 10^{-3}$ | 70 | 0 | |
| Example 9 | 0.005 | 0.30 | — | 5.1 | ≦5 | No | No | 90 | No | $2.3 \times 10^{-3}$ | 80 | 10 | |
| Example 10 | 0.08 | 0.30 | — | 5.1 | ≦5 | No | No | 50 | No | $2.5 \times 10^{-3}$ | 100 | 20 | |
| Example 11 | 0.03 | 0.10 | — | 5.0 | ≦1 | No | 15 | 90 | No | $1.2 \times 10^{-3}$ | 90 | 0 | |
| Example 12 | — | 0.02 | 0.005 | 5.6 | ≦5 | No | No | 100 | No | $2.1 \times 10^{-3}$ | 90 | 20 | |
| Example 13 | — | 0.10 | 0.03 | 5.4 | ≦1 | No | No | 100 | No | $9.9 \times 10^{-4}$ | 70 | 0 | |
| Example 14 | — | 0.18 | 0.05 | 5.3 | ≦1 | No | No | 100 | No | $1.0 \times 10^{-3}$ | 70 | 0 | |
| Example 15 | 0.025 | 0.10 | 0.005 | 5.4 | ≦1 | No | No | 100 | No | $1.1 \times 10^{-3}$ | 70 | 0 | |
| Example 16 | 0.03 | 0.10 | — | 3.9 | ≦1 | No | No | 100 | No | $7.2 \times 10^{-4}$ | 60 | 0 | Ion Plating |
| Example 17 | 0.065 | 0.115 | — | 5.4 | ≦1 | No | No | 100 | No | $8.8 \times 10^{-4}$ | 40 | 0 | |
| Example 18 | 0.06 | 0.098 | — | 5.5 | ≦1 | No | No | 100 | No | $8.9 \times 10^{-4}$ | 50 | 0 | |
| Example 19 | 0.035 | 0.15 | — | 5.3 | ≦1 | No | No | 100 | No | $9.7 \times 10^{-4}$ | 60 | 0 | |
| Example 20 | 0.08 | 0.18 | — | 5.2 | ≦1 | No | No | 100 | No | $9.8 \times 10^{-4}$ | 60 | 0 | |
| Example 21 | 0.09 | 0.18 | — | 5.2 | ≦1 | No | No | 100 | No | $1.2 \times 10^{-3}$ | 70 | 0 | Sintering co-agent addition Titanium oxide |
| Example 22 | — | 0.098 | 0.05 | 5.5 | ≦1 | No | No | 100 | No | $9.8 \times 10^{-4}$ | 50 | 0 | |
| Example 23 | 0.025 | 0.10 | 0.025 | 5.3 | ≦1 | No | No | 100 | No | $9.1 \times 10^{-4}$ | 50 | 0 | |
| Example 24 | 0.065 | 0.115 | — | 5.6 | ≦1 | No | No | 100 | No | $7.8 \times 10^{-4}$ | 30 | 0 | Hot press method |
| Comparative Example 1 | 0.05 | 0.00 | — | 5.7 | ≦1 | No | No | 100 | No | $8.3 \times 10^{-4}$ | 560 | 180 | |
| Comparative Example 2 | 0.10 | 0.02 | — | 5.6 | ≦5 | No | No | 100 | No | $6.1 \times 10^{-3}$ | 420 | 120 | |
| Comparative Example 3 | 0.08 | 0.01 | — | 5.6 | ≦5 | No | No | 100 | No | $1.6 \times 10^{-3}$ | 250 | 100 | |
| Comparative Example 4 | 0.08 | 0.32 | — | 5.1 | ≦5 | No | 25 | 40 | No | $6.7 \times 10^{-3}$ | 310 | 20 | |
| Comparative Example 5 | 0.08 | 0.32 | — | 4.8 | ≦5 | Yes | 45 | — | — | — | — | — | Arc discharge (film-formation impossible) |

In the above Example 1, because the oxide sintered body has zinc oxide as a main component, and still more contains magnesium in specified amount, when this was used as a sputtering target, arc discharge was not generated even in direct-current sputtering, and a transparent conductive film was able to be formed. In addition, it is understood that, in Examples 2 to 10, Examples 12 to 15, and Examples 17 to 24, because an oxide sintered body still more containing gallium and/or aluminum was made, electrical conductivity of the obtained transparent conductive film was able to be improved further. In particular, in Examples 7 to 8, Example 14, Examples 17 to 19, and Examples 22 to 23, by setting gallium and/or aluminum, and magnesium to specific composition range, and also in Example 24, by adoption of hot press as a sintering method, crystallinity of the film was able to be enhanced significantly, resulting in further improvement of not only electrical conductivity but also chemical resistance.

It should be noted that in Example 11, it can be understood that, although density of the obtained oxide sintered body was lowered a little due to change of mixing time of raw material powders, chemical resistance and electrical conductivity of the obtained transparent conductive film was not affected so much.

used as an ion plating target, a transparent conductive film excellent in chemical resistance was able to be formed similarly to in sputtering.

In addition, in Example 25, a transparent conductive substrate using a transparent conductive film excellent in chemical resistance was able to be obtained.

On the other hand, in Comparative Example 1, because a conventional oxide sintered body added with gallium but not added with magnesium was used, and in Comparative Examples 2 to 5, because the addition amounts of magnesium and gallium were outside a range of the present invention, although they were added, chemical resistance and electrical conductivity of the obtained transparent conductive film obtained by using this were insufficient. In Comparative Example 5, because raw material powders with large average particle size were used, and mixing time was extremely short time, a magnesium oxide phase was generated in the oxide sintered body, arc discharge was generated in sputtering, which prevented formation of a transparent conductive film.

An oxide sintered body of the present invention is used as a sputtering target, without generation of arc discharge even by direct-current sputtering, and is capable of forming a transparent conductive film excellent in chemical resistance. In addition, an oxide sintered body further containing gallium and/or aluminum in specific amount is capable of improving electrical conductivity of the transparent conductive film further.

In addition, an oxide sintered body of the present invention can be used similarly to a tablet for ion plating, and is capable of attaining high speed film-formation. A zinc oxide-type transparent conductive film of the present invention obtained by using this, because of being controlled to have an optimal composition and crystal phase, exhibits excellent chemical resistance without impairing widely visible light transmittance and electric specific resistance, and is extremely useful industrially as a transparent conductive film without using relatively expensive indium, and a transparent conductive substrate having the same.

What is claimed is:

1. An oxide sintered body, characterized in that
the body comprises zinc oxide, magnesium, gallium and/or aluminum, and content of gallium and/or aluminum is over 0 and equal to or lower than 0.09 as atom number ratio of (Ga+Al)/(Zn+Ga+Al), that
content of magnesium is from 0.02 to 0.30 as atom number ratio of Mg/(Zn+Ga+Al+Mg), and that
the body lacks a magnesium oxide phase.

2. The oxide sintered body according to claim 1, characterized in that content of magnesium is from 0.05 to 0.18 as atom number ratio of Mg/(Zn+Ga+Al+Mg).

3. The oxide sintered body according to claim 1, characterized in that content of gallium and/or aluminum is from 0.01 to 0.08 as atom number ratio of (Ga+Al)/(Zn+Ga+Al).

4. The oxide sintered body according to claim 1, characterized in that content of gallium and/or aluminum is from 0.035 to 0.08 as atom number ratio of (Ga+Al)/(Zn+Ga+Al), and content of magnesium is from 0.098 to 0.18 as atom number ratio of Mg/(Zn+Ga+Al+Mg).

5. The oxide sintered body according to claim 1, characterized in that peak intensity ratio by X-ray diffraction measurement represented by the following expression (A), is equal to or lower than 15%:

$$I[MgGa_2O_4(311)+MgAl_2O_4(311)]/I[ZnO(101)] \times 100 \ (\%) \quad (A)$$

wherein I[MgGa$_2$O$_4$(311)+MgAl$_2$O$_4$(311)] represents a sum of (311) peak intensity of a complex oxide MgGa$_2$O$_4$ phase having a rock salt structure of cubic crystal, and (311) peak intensity of a MgAl$_2$O$_4$ phase, and I[ZnO(101)] represents (101) peak intensity of an zinc oxide phase having a wurtzite structure of hexagonal crystal.

6. The oxide sintered body according to claim 1, characterized in that the specific resistance is equal to or lower than 5 kΩcm.

7. The oxide sintered body according to claim 1, characterized in that the oxide sintered body is obtained by formation and sintering by using a hot press method.

8. The oxide sintered body according to claim 1, wherein an average particle size of raw material powders comprised in the oxide sintered body is equal to or smaller than 3 μm.

9. A target obtained by processing the oxide sintered body according to claim 1.

10. The target according to claim 9, characterized in that density thereof is equal to or higher than 5.0 g/cm$_3$, and it is used in a sputtering method.

11. The target according to claim 9, characterized in that the density thereof is from 3.5 to 4.5 g/cm$_3$, and it is used in an ion plating method.

12. A transparent conductive film formed on a substrate by a sputtering method or an ion plating method, by using the target according to claim 9.

13. The transparent conductive film according to claim 12, characterized in that comprises zinc oxide, magnesium, gallium and/or aluminum, and content of gallium and/or aluminum is over 0 and equal to or lower than 0.09 as atom number ratio of (Ga+Al)/(Zn+Ga+Al), and content of magnesium is from 0.02 to 0.30 as atom number ratio of Mg/(Zn+Ga+Al+Mg).

14. The transparent conductive film according to claim 13, characterized in that content of magnesium is from 0.05 to 0.18 as atom number ratio of Mg/(Zn+Ga+Al+Mg).

15. The transparent conductive film according to claim 13, characterized in that content of gallium and/or aluminum is from 0.01 to 0.08 as atom number ratio of (Ga+Al)/(Zn+Ga+Al).

16. The transparent conductive film according to claim 13, characterized in that content of gallium and/or aluminum is from 0.035 to 0.08 as atom number ratio of (Ga+Al)/(Zn+Ga+Al), and content of magnesium is from 0.098 to 0.18 as atom number ratio of Mg/(Zn+Ga+Al+Mg).

17. The transparent conductive film according to claim 12, characterized in that comprises mainly a zinc oxide phase having a wurtzite structure of hexagonal crystal, and peak intensity ratio by X-ray diffraction measurement represented by the following expression (B) is equal to or more than 50%:

$$I[ZnO(002)]/(I[ZnO(002)]+I[ZnO(100)]) \times 100 \ (\%) \quad (B)$$

(wherein I[ZnO(002)] represents (002) peak intensity of the zinc oxide phase having a wurtzite structure of hexagonal crystal, and l[ZnO(100)] represents (100) peak intensity of the zinc oxide phase having a wurtzite structure of hexagonal crystal).

18. The transparent conductive film according to claim 12, characterized in that the zinc oxide phase having a rock salt structure of cubic crystal is not contained substantially.

19. A transparent conductive substrate, characterized in that provides a transparent substrate and the transparent conductive film according to claim 12 formed on one surface or both surfaces of said transparent substrate, and said transparent substrate is any of a glass plate, a quartz plate, a resin plate or a resin film whose one surface or both surfaces is covered with a gas barrier film, or a resin plate or a resin film inserted with a gas barrier film inside thereof.

20. The transparent conductive substrate according to claim 19, characterized in that said gas barrier film is at least one selected from a silicon oxide film, a silicon oxynitride film, a magnesium aluminate film, a tin oxide film and a diamond-like carbon film.

21. The transparent conductive substrate according to claim 19, characterized in that said resin plate or resin film is made of polyethyleneterephtharate, polyethersulfone, polyarylate, polycarbonate, or a laminated structure body whose surface is covered with an acrylic organic substance.

* * * * *